(12) United States Patent
Kim et al.

(10) Patent No.: US 11,189,686 B2
(45) Date of Patent: Nov. 30, 2021

(54) INTEGRATED DEVICE COUPLED TO A CAPACITOR STRUCTURE COMPRISING A TRENCH CAPACITOR

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/798,161

(22) Filed: Feb. 21, 2020

(65) Prior Publication Data

US 2021/0098567 A1 Apr. 1, 2021

Related U.S. Application Data

(60) Provisional application No. 62/908,468, filed on Sep. 30, 2019.

(51) Int. Cl.
| | |
|---|---|
| *H01L 49/02* | (2006.01) |
| *H01L 23/498* | (2006.01) |
| *H01L 25/065* | (2006.01) |
| *H01L 23/31* | (2006.01) |
| *H01L 23/48* | (2006.01) |

(52) U.S. Cl.
CPC .......... *H01L 28/90* (2013.01); *H01L 23/3128* (2013.01); *H01L 23/481* (2013.01); *H01L 23/49822* (2013.01); *H01L 25/0657* (2013.01)

(58) Field of Classification Search
CPC ........ H01L 27/10829; H01L 23/49822; H01L 23/481; H01L 25/0657; H01L 23/3128; H01L 28/90; H01L 29/945
See application file for complete search history.

(56) References Cited

U.S. PATENT DOCUMENTS

| | | | |
|---|---|---|---|
| 2010/0244189 A1* | 9/2010 | Klootwijk | H01L 27/0805 257/532 |
| 2016/0276324 A1* | 9/2016 | Lin | H01L 23/49827 |

* cited by examiner

*Primary Examiner* — Jasmine J Clark
(74) *Attorney, Agent, or Firm* — Qualcomm Incorporated

(57) ABSTRACT

A package that includes a substrate, an integrated device coupled to the substrate, and a capacitor structure located between the substrate and the integrated device. The capacitor structure includes a capacitor substrate comprising a first trench, a first electrically conductive layer located in the first trench, a dielectric layer located over the first electrically conductive layer, and a second electrically conductive layer located over the dielectric layer. The first electrically conductive layer over the first trench, the dielectric layer and the second electrically conductive layer are configured as a first capacitor.

30 Claims, 27 Drawing Sheets

PROFILE VIEW

PLAN VIEW

PROFILE VIEW

PROFILE VIEW

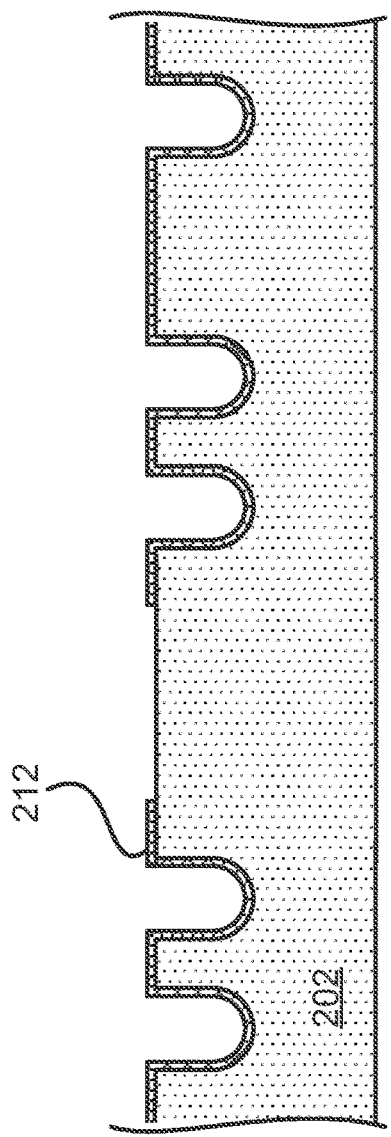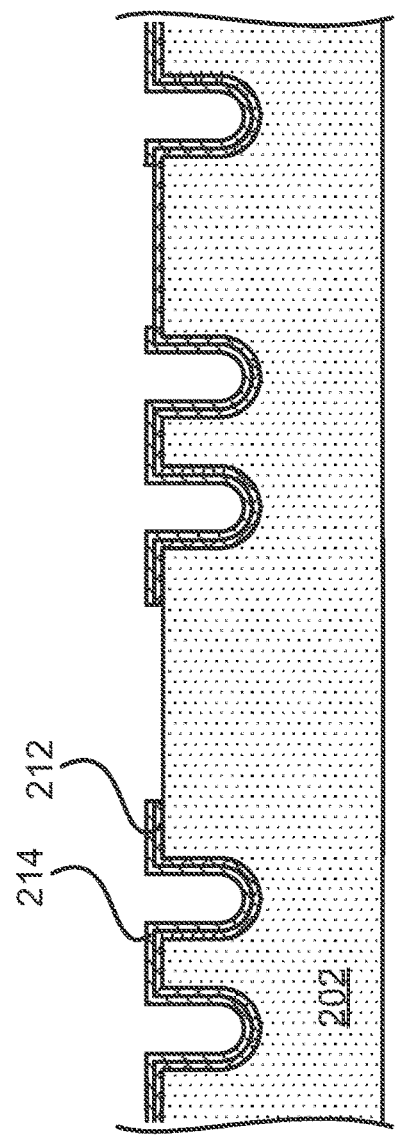
FIG. 12B

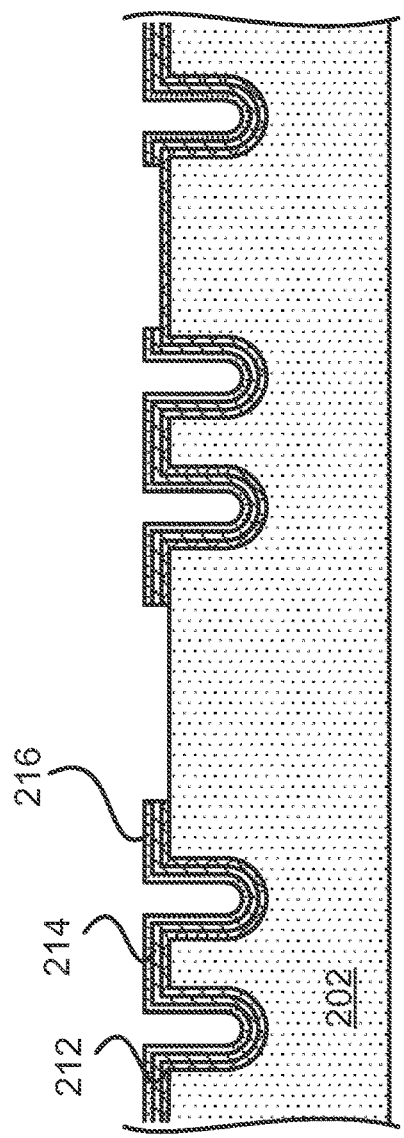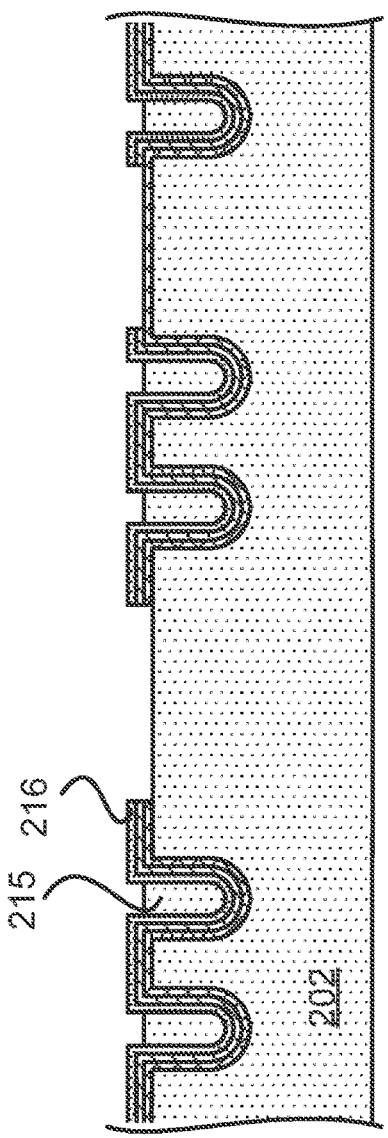
FIG. 12C

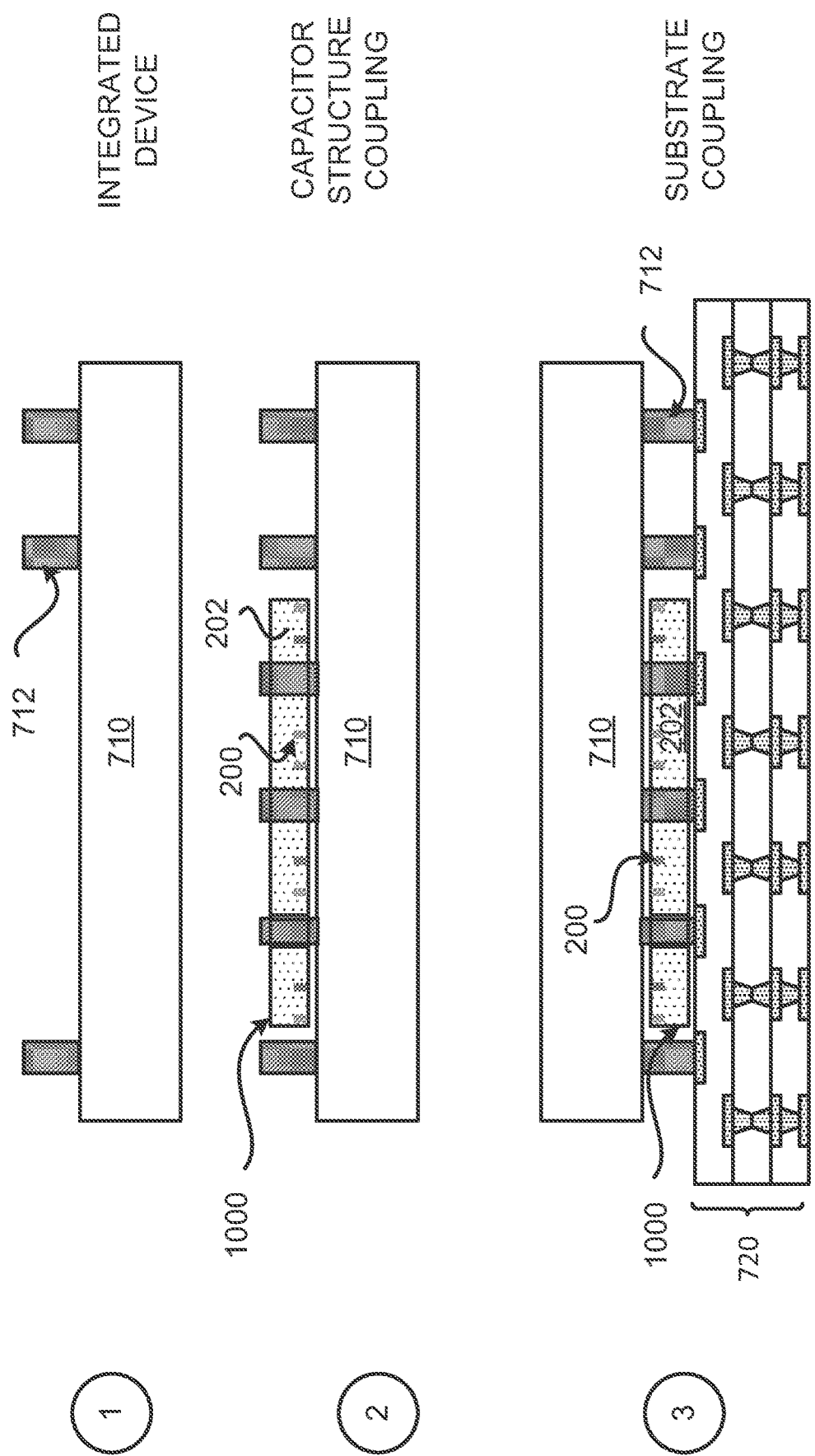

INTEGRATED DEVICE COUPLED TO A CAPACITOR STRUCTURE COMPRISING A TRENCH CAPACITOR

CROSS-REFERENCE/CLAIM OF PRIORITY TO RELATED APPLICATION

The present application claims priority to and the benefit of U.S. Provisional Application No. 62/908,468, filed on Sep. 30, 2019, and titled, "INTEGRATED DEVICE COUPLED TO A CAPACITOR STRUCTURE COMPRISING A TRENCH CAPACITOR", which is hereby expressly incorporated by reference.

FIELD

Various features relate to integrated devices and capacitors, but more specifically to an integrated device coupled to a capacitor structure comprising trench capacitors.

BACKGROUND

FIG. 1 illustrates a package 100 that includes a substrate 102, a die 104 and an encapsulation layer 160. The die 104 is coupled to a first surface of the substrate 102 through a plurality of solder interconnects 140, which may include bumps and pillars. The substrate 102 includes a plurality of dielectric layers 120 and a plurality of interconnects 122. Each layer of the dielectric layers 120 includes a patterned metal layer. The substrate 102 includes a first solder resist layer 124, a second solder resist layer 126, and a plurality of solder interconnects 130. The encapsulation layer 160 encapsulates the die 104. A capacitor 180 is coupled to a bottom portion of the substrate 102. The position of the capacitor 180 may limit the performance of the package 100. There is an ongoing need to improve the performance of packages.

SUMMARY

Various features relate to integrated devices and capacitors, but more specifically to an integrated device coupled to a capacitor structure comprising trench capacitors.

One example provides a package that includes a substrate, an integrated device coupled to the substrate, and a capacitor structure located between the substrate and the integrated device. The capacitor structure includes a capacitor substrate comprising a first trench, a first electrically conductive layer located in the first trench, a dielectric layer located over the first electrically conductive layer, and a second electrically conductive layer located over the dielectric layer. The first electrically conductive layer over the first trench, the dielectric layer and the second electrically conductive layer are configured as a first capacitor.

Another example provides an apparatus that includes a substrate, an integrated device coupled to the substrate, and a capacitor structure located between the substrate and the integrated device. The capacitor structure includes a capacitor substrate and a first means for trench capacitance located over the capacitor substrate.

Another example provides a method for fabricating a package. The method provides an integrated device. The method couples a capacitor structure to the integrated device. The capacitor structure includes a capacitor substrate comprising a first trench, a first electrically conductive layer located in the first trench, a dielectric layer located over the first electrically conductive layer, and a second electrically conductive layer located over the dielectric layer. The first electrically conductive layer over the first trench, the dielectric layer and the second electrically conductive layer are configured as a first capacitor. The method couples the integrated device to a substrate such that the capacitor structure is located between the substrate and the integrated device.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an integrated device coupled to the substrate, and a capacitor structure located between the substrate and the integrated device. The capacitor structure includes a capacitor substrate comprising a first trench, a first electrically conductive layer located in the first trench, a dielectric layer located over the first electrically conductive layer, and a second electrically conductive layer located over the dielectric layer. The first electrically conductive layer over the first trench, the dielectric layer and the second electrically conductive layer are configured as a first capacitor. The use of the capacitor structure allows a capacitor to be located closer to the integrated device, which may help improve the performance of the integrated device. Moreover, the capacitor structure may be configured to provide a capacitor having high capacitance properties (e.g., capacitance density) while having a relatively small size and/or footprint.

Exemplary Trench Capacitor in a Substrate

Figure 1:
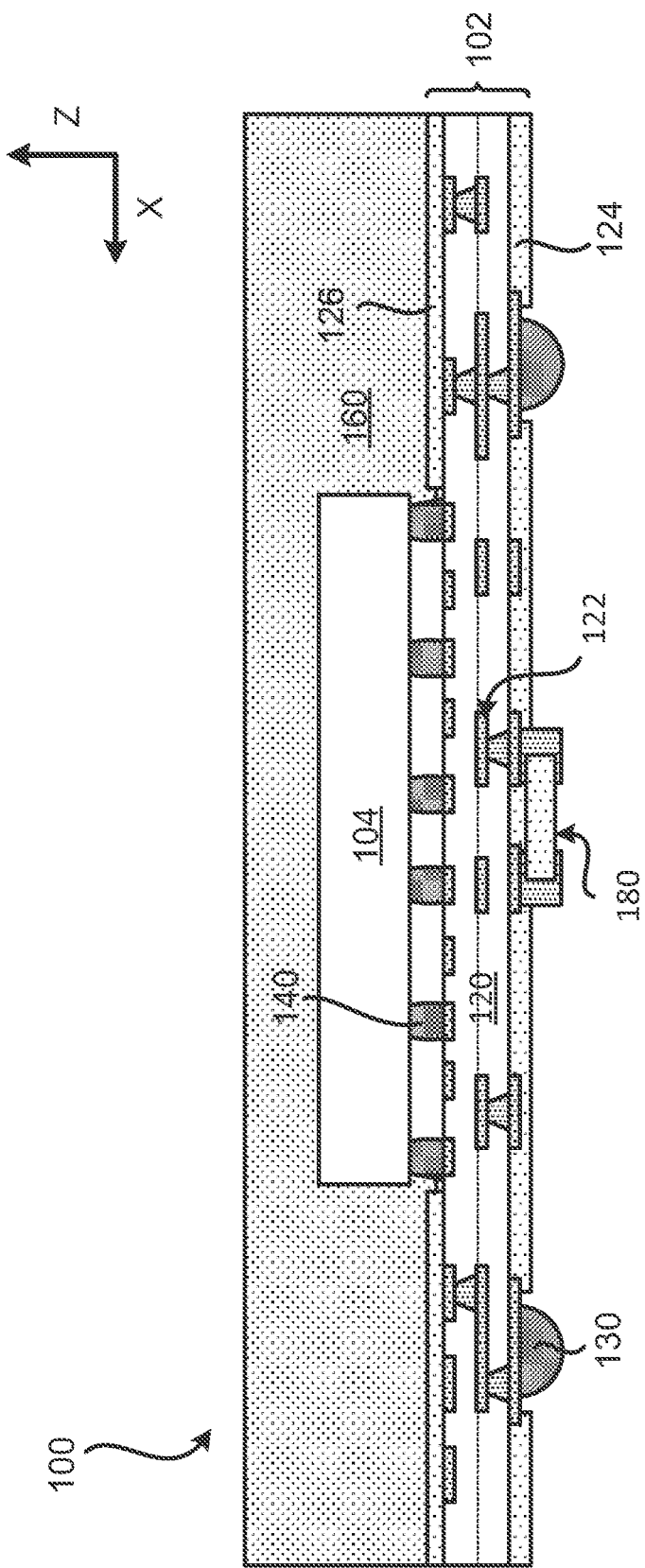
FIG. 1 illustrates a profile view of a device that includes a die, a substrate and a capacitor.
Figure 2:
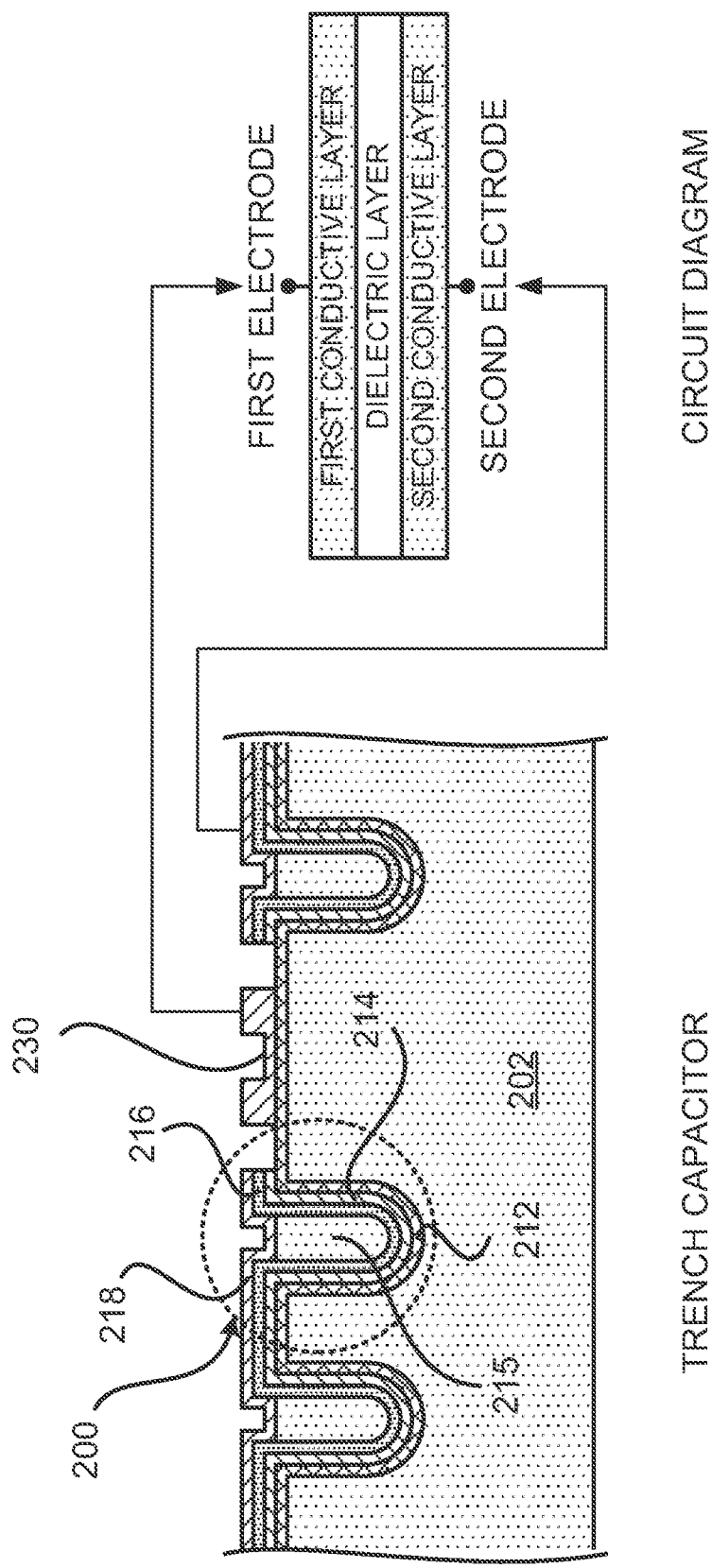
FIG. 2 illustrates a profile view of an exemplary trench capacitor in a substrate.

FIG. 2 illustrates an example of a trench capacitor 200 that may be implemented in a substrate 202. FIG. 2 illustrates the substrate 202, a first electrically conductive layer 212, a dielectric layer 214, a second electrically conductive layer 216, a filler 215, a second contact layer 218, and a first contact layer 230. The trench capacitor 200 may be means for trench capacitance. The trench capacitor 200 may be a type of capacitor.

The first electrically conductive layer 212, the dielectric layer 214, the second electrically conductive layer 216, and the filler 215 may be located over (i) a first surface of the substrate 202 and (ii) in one or more trenches of the substrate 202. The first electrically conductive layer 212 is located (e.g., formed) over (i) the first surface of the substrate 202 and (ii) in one or more trenches of the substrate 202. The dielectric layer 214 is located over the first electrically conductive layer 212. Portions of the dielectric layer 214 may be located in one or more trenches of the substrate 202. The second electrically conductive layer 216 may be located over the dielectric layer 214. Portions of the second electrically conductive layer 216 may be located in one or more trenches of the substrate 202. The second contact layer 218 may be located over the second electrically conductive layer 216. The first contact layer 230 may be located over the first electrically conductive layer 212.

The trench capacitor 200 includes the first electrically conductive layer 212, the dielectric layer 214 and the second electrically conductive layer 216. In some implementations, the trench capacitor 200 may be defined by portions of the first electrically conductive layer 212, portions of the dielectric layer 214 and portions of the second electrically conductive layer 216 that are located in the trench of substrate 202. It is noted that the trenches of the substrate 202 may not be visible in FIG. 2 because the trenches of the substrate 202 may be filled or partially filled with material (e.g., solid material). The shape and/or size of the trenches may vary with different implementations. An example of a trench in a substrate is illustrated and described in FIG. 12A.

The substrate 202 may include silicon (Si). The first electrically conductive layer 212 may include N+ silicon. The second electrically conductive layer 216 may include N+ poly silicon. The first electrically conductive layer 212 may include N+ poly silicon, and the second electrically conductive layer 216 may include N+ silicon. It is noted that different implementations may use different materials and/or different combinations of materials for the first electrically conductive layer 212 and/or the second electrically conductive layer 216. For example, the first electrically conductive layer 212 and/or the second electrically conductive layer 216 may include P+ silicon, P+ poly silicon, copper (Cu), aluminum (Al), and/or other metals. The dielectric layer 214 may include $Al_2O_3$, $HfO_2$, $Ta_2O_5$, SiN, and/or combinations thereof. The filler 215 may include Ajinomoto Buildup Film (ABF) or other similar materials. The second contact layer 218 and/or the first contact layer 230 may include metal (e.g., copper, aluminum).

FIG. 2 also illustrates a circuit diagram that may conceptually represent the trench capacitor 200. The first electrode of the circuit diagram may be the first contact layer 230. The second electrode of the circuit diagram may be the second contact layer 218. As will be further described below, several trench capacitors may be configured to be electrically coupled together to provide an effective capacitor with high capacitance (e.g., high capacitance density).

Figure 3:
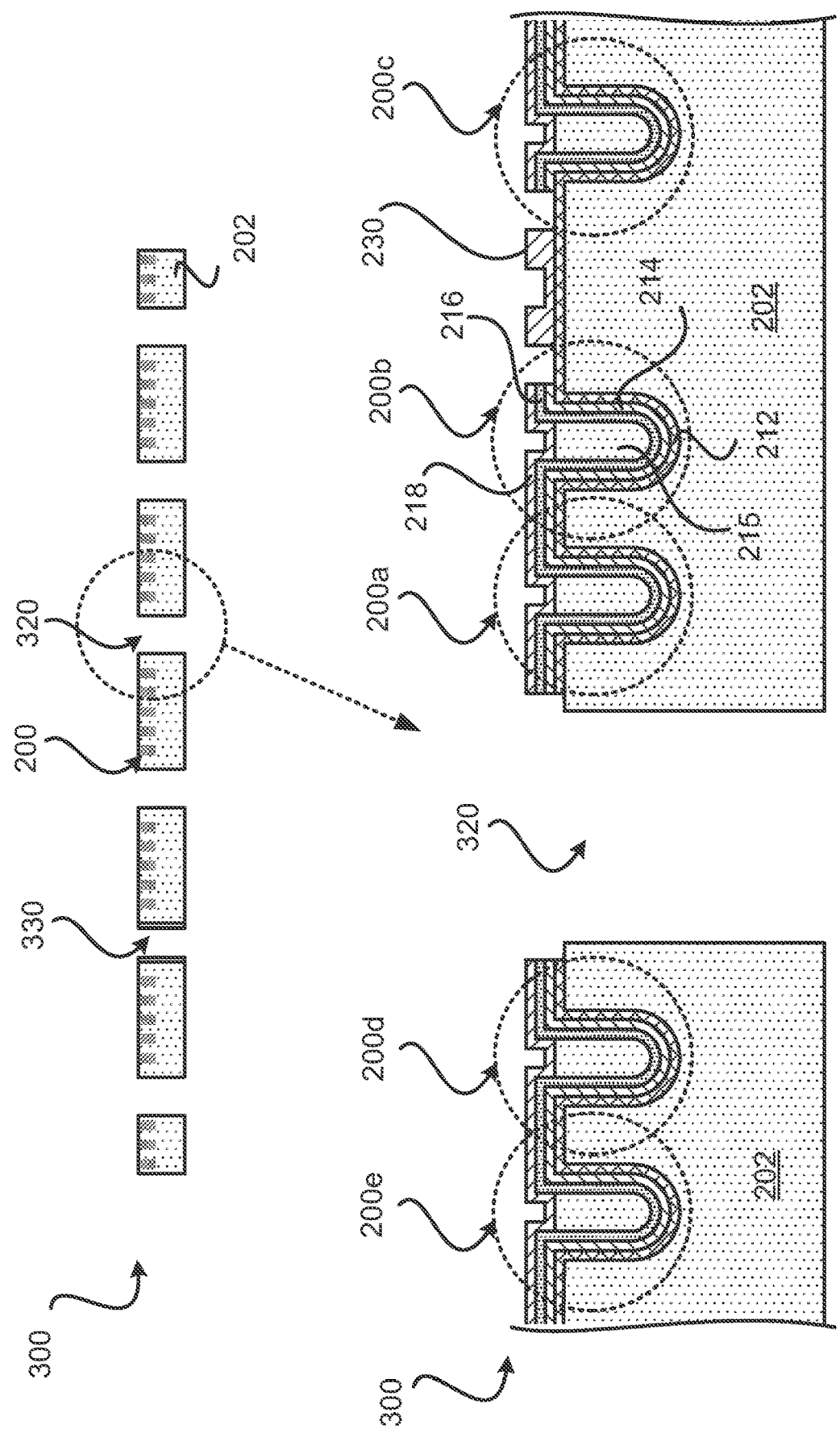
FIG. 3 illustrates a profile view of an exemplary substrate that includes a plurality of trench capacitors.
Figure 4:
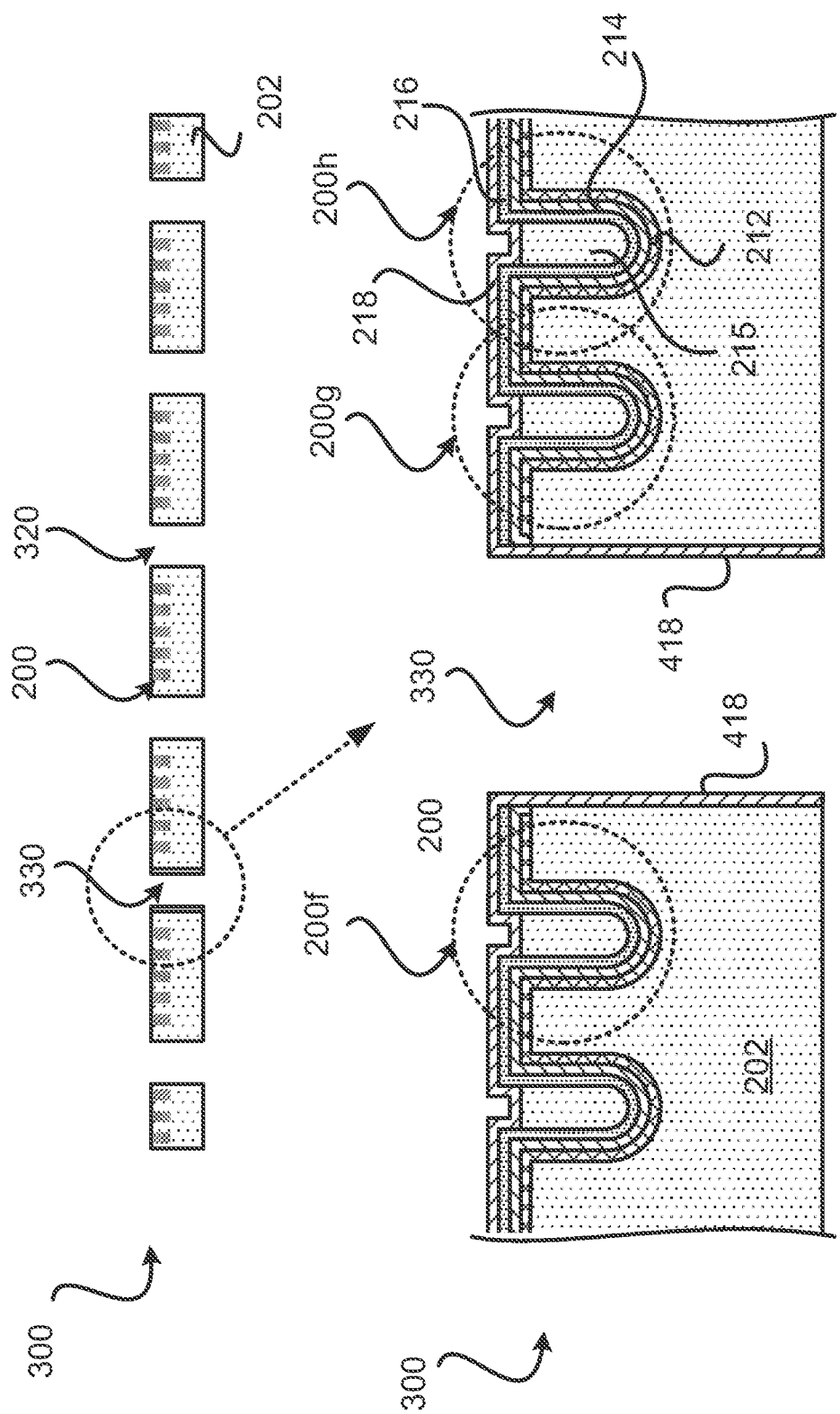
FIG. 4 illustrates a profile view of an exemplary substrate that includes a plurality of trench capacitors.

FIGS. 3 and 4 illustrate a capacitor structure 300 that includes a capacitor substrate 202, a plurality of trench capacitors 200 (e.g., 200a-200h), one or more cavities 320 and one or more cavities 330. As will be further described below, the capacitor structure 300 may be implemented with an integrated device, a substrate, a package and/or a board (e.g., printed circuit board). The capacitor structure 300 is configured to provide a low-profile capacitor having a high capacitance (e.g., capacitance density), that can be positioned very close to an integrated device to help improve the performance of the integrated device.

As shown in FIG. 3, the capacitor structure 300 includes the plurality of trench capacitors 200 (e.g., first trench capacitor, second trench capacitor, third trench capacitor, etc.) that is formed in the substrate 202 (e.g., in and/or over a first surface of the substrate 202). One or more of the trench capacitors (e.g., 200a, 200b, 200c, 200d, 200e) may be configured to be electrically coupled together in parallel to collectively provide an effective capacitor having a high capacitance (e.g., capacitance density). In some implementations, the capacitor structure 300 may be configured as a capacitor having a capacitance density of at least 500 nanofarads per square millimeters ($(nF)/mm^2$) The substrate 202 may have a thickness of approximately 100 micrometers (μm) or less. The trench in the substrate 202, over which the trench capacitor is formed may have a depth in a range of approximately 5-40 micrometers (μm).

Each respective trench capacitor (e.g., 200a, 200b, 200c, 200d, 200e) from the plurality of the trench capacitors 200 may be defined by respective portions of the first electrically conductive layer 212, respective portions of the dielectric layer 214 and respective portions of the second electrically conductive layer 216 that are located in a respective trench of the substrate 202. Thus, for example a first trench capacitor (e.g., 200a) may be defined in a first trench of the substrate 202, and a second trench capacitor (e.g., 200b) may be defined in a second trench of the substrate 202. The first trench capacitor (e.g., 200a) may be configured to be electrically coupled in parallel to the second trench capacitor (e.g., 200b). It is noted that any of the trench capacitor from the plurality of trench capacitors 200 may be the first or second trench capacitors. As such, the use of the terms first trench capacitor and second trench capacitor are not limited to any particular trench capacitor in the disclosure. As mentioned above, a trench capacitor may be a type of capacitor. Thus, for example, a first trench capacitor may be a first capacitor, and a second trench capacitor may be a second capacitor.

FIG. 3 illustrates a cavity 320 that travels through the substrate 202. The cavity 320 is configured to allow an interconnect to travel through the substrate 202. In some implementations, the interconnect that travels through the cavity 320 of the substrate 202, may be coupled to an integrated device and a substrate. In some implementations, the interconnect that travels through the cavity 320 of the substrate 202, may be coupled to a substrate and a board (e.g., printed circuit board (PCB)). As will be further described below in at least FIGS. 7-11, the interconnect that travels through the cavity 320 may include one or more interconnects. The interconnect that travels through the cavity 320 may include a pillar, a via and/or solder interconnect. The interconnect that travels through the cavity 320 may not be in direct contact with (e.g., not directly touching) the first electrically conductive layer 212, the second electrically conductive layer 216, the first contact layer 230 and/or the second contact layer 218.

FIG. 4 illustrates a close-up view of another portion of the capacitor structure 300. As shown in FIG. 4, the capacitor structure 300 includes the capacitor substrate 202, the cavity 330, a trench cavity 200f, a trench cavity 200g and a trench cavity 200h. Two or more of the trenches may be configured to be electrically coupled together in parallel.

As shown in FIG. 4, the cavity 330 that travels through the substrate 202. A wall of the cavity 330 may be covered with a contact layer 418. The contact layer 418 may include a metal layer (e.g., copper). The contact layer 418 may be coupled to the second contact layer 218. The cavity 330 is configured to allow an interconnect to travel through the substrate 202. The interconnect that travels through the cavity 330 may be coupled to the contact layer 418. In some implementations, the contact layer 418 may be considered part of the second contact layer 218.

In some implementations, the interconnect that travels through the cavity 330 of the substrate 202, may be coupled to an integrated device and a substrate. In some implementations, the interconnect that travels through the cavity 320 of the substrate 202, may be coupled to a substrate and a board (e.g., printed circuit board (PCB)). As will be further described below in at least FIGS. 7-11, the interconnect that travels through the cavity 330 may include one or more interconnects. The interconnect that travels through the cavity 330 may include a pillar, a via and/or solder interconnect.

Different implementations may include different configurations, arrangements and/or placements of the trench capacitors. For example, the capacitor structure may include a different number of trench capacitors.

Figure 5:
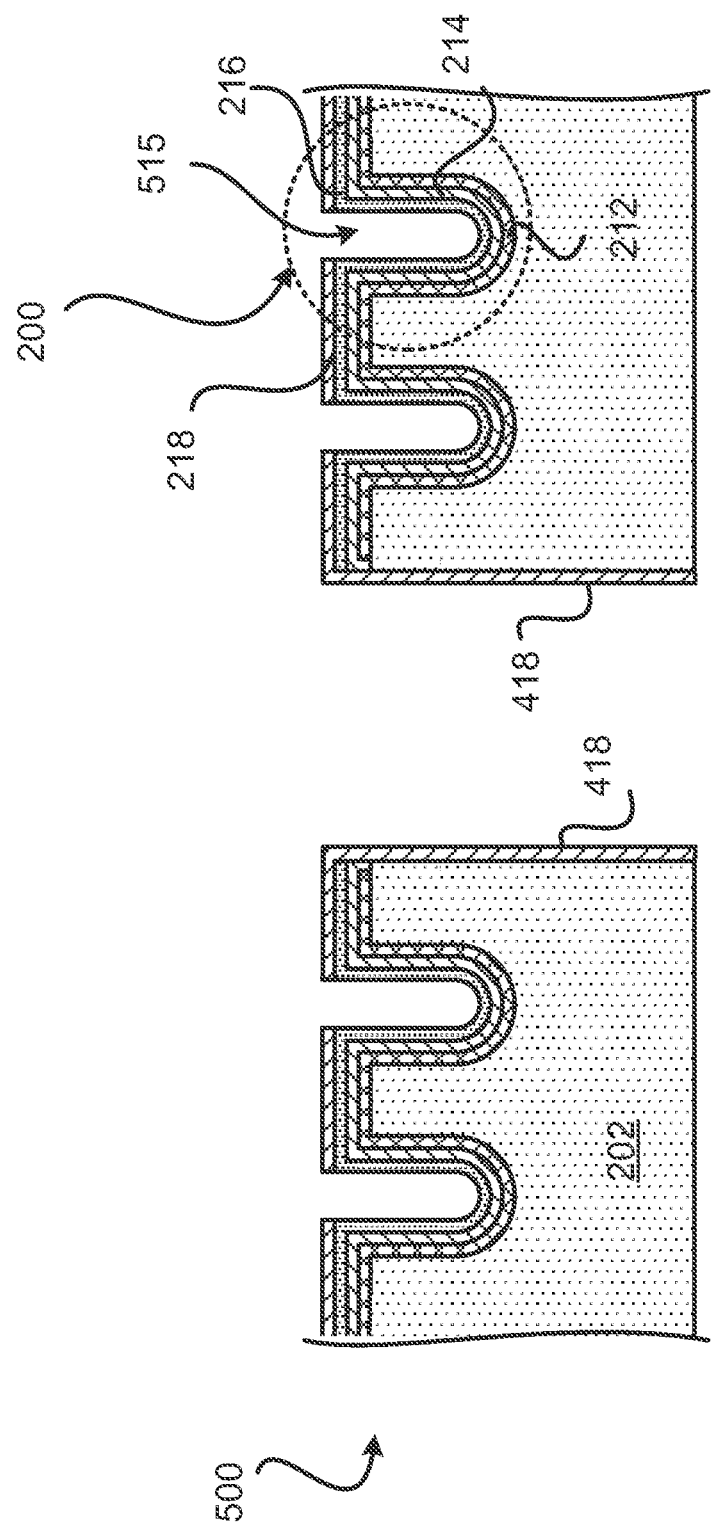
FIG. 5 illustrates a profile view of an exemplary substrate that includes a plurality of trench capacitors.

FIG. 5 illustrates a capacitor structure 500 that includes a plurality of trench capacitors 200. The capacitor structure 500 is similar to the capacitor structure 300. As shown in FIG. 5, the capacitor structure 500 includes the substrate 202, the first electrically conductive layer 212, the dielectric layer 214, and the second electrically conductive layer 216, the second contact layer 218, and the first contact layer 230. A trench capacitor 200 may be defined by at least portions of the first electrically conductive layer 212, at least portions of the dielectric layer 214, and at least portions of the second electrically conductive layer 216. FIG. 5 illustrates a space 515 that is free of a filler (e.g., solid material). Thus, the capacitor structure 500 does not include a filler for at least some of the trench capacitors 200. Thus, in some implementations, a filler (e.g., 215) may or may not be formed over one or more trench capacitors. It is noted that portions of the second contact layer 218 may be located in one or more trenches and/or the space 515. The space 515 may be a void. The capacitor structure 500 may be implemented with any of the package, integrated device, substrate, and/or board described in the disclosure.

Figure 6:
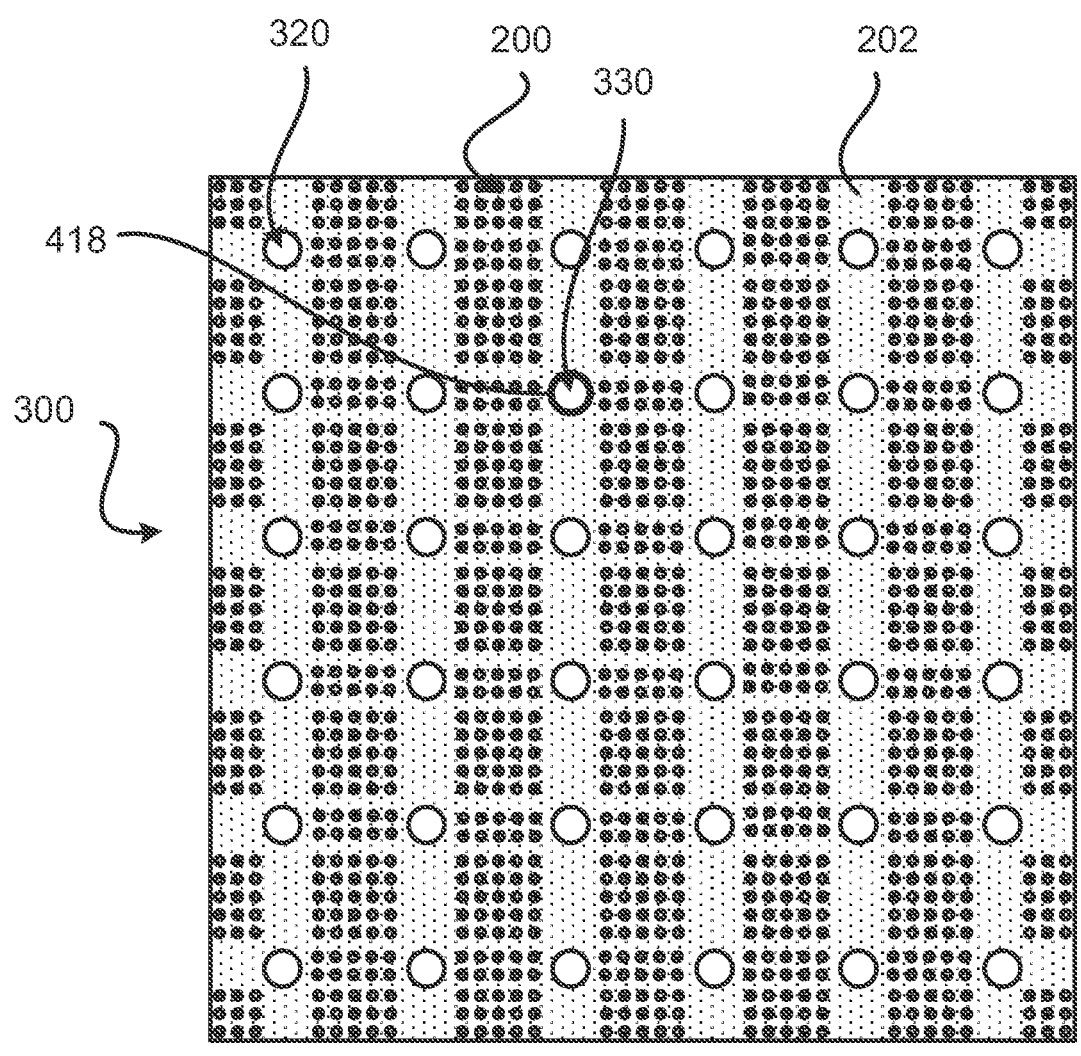
FIG. 6 illustrates a plan view of an exemplary substrate that includes a plurality of trench capacitors.

FIG. 6 illustrates a plan view of the capacitor structure 300. The capacitor structure 300 includes the capacitor substrate 202, the plurality of trench capacitors 200, a plurality of cavities 320 and at least one cavity 330. The plurality of cavities 320 and the at least one cavity 330 travel through the capacitor substrate 202. A contact layer 418 is located (e.g., formed) over a side wall of the cavity 330.

Having described a capacitor structure as a stand-alone component and/or a device, a package comprising an integrated device that is implemented with a capacitor structure will now be described in further details below.

Exemplary Packages Comprising a Trench Capacitor

Figure 7:
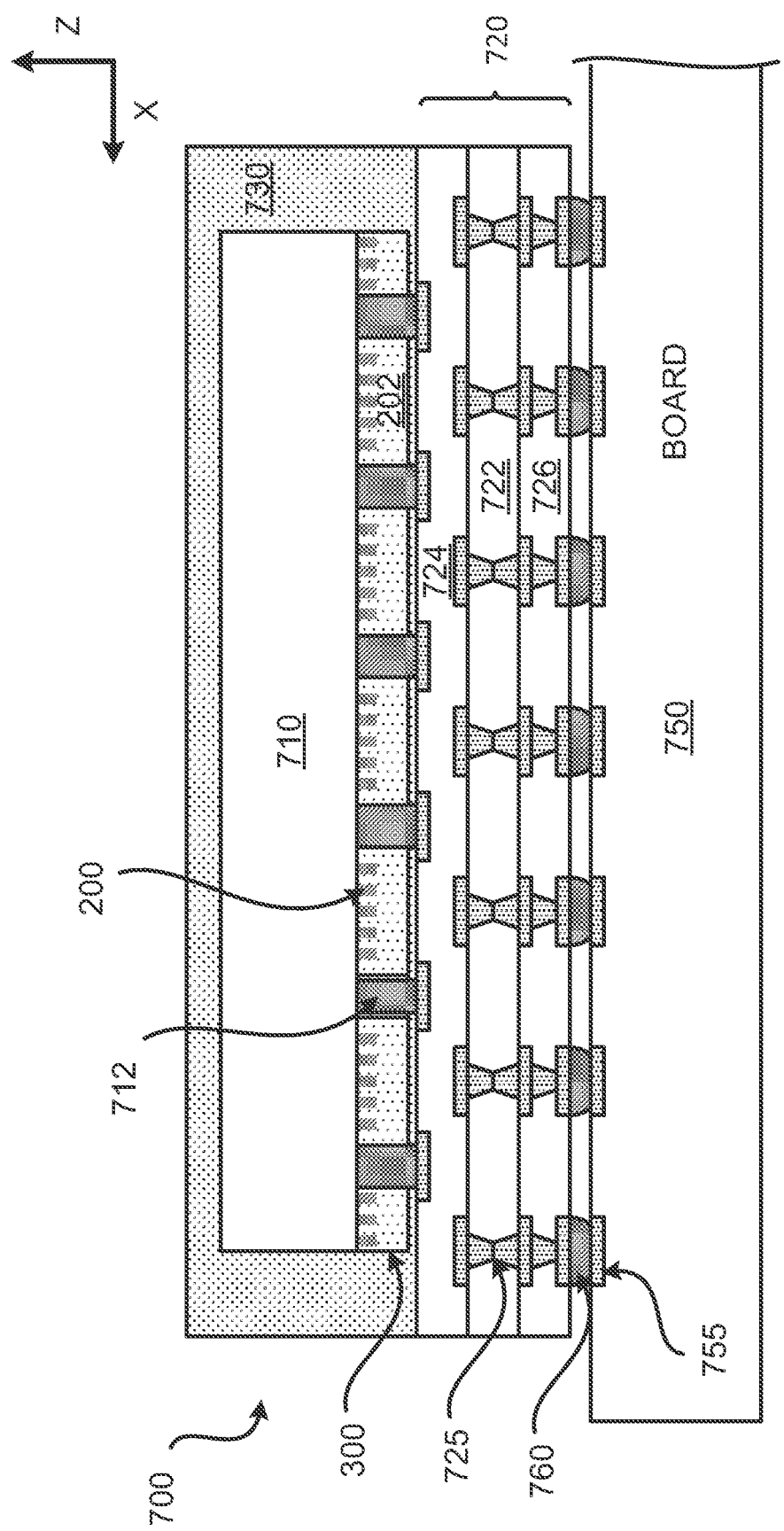
FIG. 7 illustrates a profile view of an exemplary package that includes a substrate comprising a plurality of trench capacitors.

FIG. 7 illustrates an example a package 700 that includes a capacitor structure having one or more trench capacitors. The package 700 includes an integrated device 710, the capacitor structure 300, a substrate 720, and an encapsulation layer 730. The integrated device 710 may include a die. The integrated device 710 is coupled to the substrate 720 through a plurality of interconnects 712. The plurality of interconnects 712 includes pillars and/or solder interconnects. The capacitor structure 300 is located between the substrate 720 and the integrated device 710. As will be further described below, the plurality of interconnects 712 may travel through the cavities of the capacitor structure 300. The first contact layer 230 and/or the second contact layer 218 of the capacitor structure 300 may be configured to be electrically coupled to the integrated device 710. For example, the first contact layer 230 and/or the second contact layer 218 of the capacitor structure 300 may be in contact (e.g., direct or indirect) with interconnects (e.g., pads) of the integrated device 710.

As mentioned above, the capacitor structure 300 includes the capacitor substrate 202. The capacitor substrate 202 includes a first trench, a first electrically conductive layer 212 located in the first trench, a dielectric layer 214 located over the first electrically conductive layer 212, and a second electrically conductive layer 216 located over the dielectric layer 214. At least a portion of (i) the first electrically conductive layer 212 located over the first trench, (ii) the dielectric layer 214, and (iii) the second electrically conductive layer 216 may be configured as a first capacitor (e.g., first trench capacitor) for the capacitor structure 300. The capacitor structure 300 includes a plurality of trench capacitors 200 that are configured in parallel (e.g., configured to be electrically coupled in parallel) to collectively provide a capacitor structure 300 having a high capacitance (e.g., capacitance density). In some implementations, the capacitor structure 300 may have an effective capacitance density of at least 500 nanofarads per square millimeters ($(nF)/mm^2$) This is made possible because forming the capacitors in the trenches of the capacitor substrate 202 effectively increases the surface area to form the capacitor without having to increase the overall size of the capacitor substrate 202.

Moreover, the size and profile of the capacitor structure 300 allows the capacitor structure 300 to be placed near the integrated device 710, thus making the capacitor structure 300 much more effective at improving the performance of the integrated device 710. For example, if the capacitor structure 300 is configured to be used as part of a power distribution network (PDN) circuit for the integrated device 710, placing the capacitor structure 300 as close as possible to the integrated device 710 may help reduce the loop inductance of the PDN circuit for the integrated device 710. In some implementations, the capacitor structure 300 is positioned between the integrated device 710 and the substrate 720 such that one or more capacitors (e.g., trench capacitors) are located within 50 micrometers (μm) of a surface (e.g., front side surface, active surface) of the integrated device 710. In some implementations, all of the capacitors (e.g., trench capacitors) of the capacitor structure 300 are located within 50 micrometers (μm) of a surface (e.g., front side surface, active surface) of the integrated device 710.

Thus, the capacitor structure 300 (or any of the capacitor structures) described in the disclosure provides at least two technical advantages. One, the design of the capacitor structure 300 to include trench capacitors configured to be electrically coupled in parallel, allows the capacitor structure 300 to have a high capacitance density. In some implementations, a high capacitance density may include more than 250 nanofarads per square millimeters ((nF)/mm$^2$) As mentioned above, the capacitor structure 300 may be configured to provide a capacitance density of at least 500 nanofarads per square millimeters ((nF)/mm$^2$) However, the capacitance density of the capacitor structure 300 may be less. Two, the low profile of the capacitor structure 300 allows the capacitor structure 300 to be placed very closely to the integrated device 710, thus allowing the capacitor structure 300 to have a more meaningful impact on the performance of the integrated device. The coupling of the capacitor structure 300 to the integrated device 710 may be further done without increasing the overall height of the package 700.

The substrate 720 includes one or more dielectric layers (e.g., 722, 724, 726), and a plurality of interconnects (e.g., traces, pads, vias) 725. The encapsulation layer 730 is located over the substrate 720 such that the encapsulation layer 730 encapsulates the integrated device 710. The encapsulation layer 730 may also encapsulate at least part of the capacitor structure 300. The encapsulation layer 730 may be means for encapsulation. The plurality of interconnects 712 is coupled to the integrated device 710 and the plurality of interconnects 725 of the substrate 720. The plurality of interconnects 712 travels through the cavities (e.g., 320, 330) of the capacitor structure 300. At least one interconnect from the plurality of interconnects 712 may be coupled to contact layer (e.g., 418) of the capacitor structure 300.

The package 700 may be coupled to a board 750 (e.g., PCB) through a plurality of solder interconnects 760. In particular, the substrate 720 may be coupled to the board 750 through the plurality of solder interconnects 760. For example, the plurality of solder interconnects may be coupled to the plurality of interconnects 725 (of the substrate 720) and the plurality of interconnects 755 (of the board 750).

FIG. 7 illustrates that the capacitor structure 300 has lateral dimensions that are approximately the same as the lateral dimensions of the integrated device 710. For example, the width and/or length of the capacitor structure 300 may be approximately the same as the width and/or length of the integrated device 710. However, in some implementations, the dimensions of the capacitor structure 300 and the integrated device 710 may be different.

Figure 8:
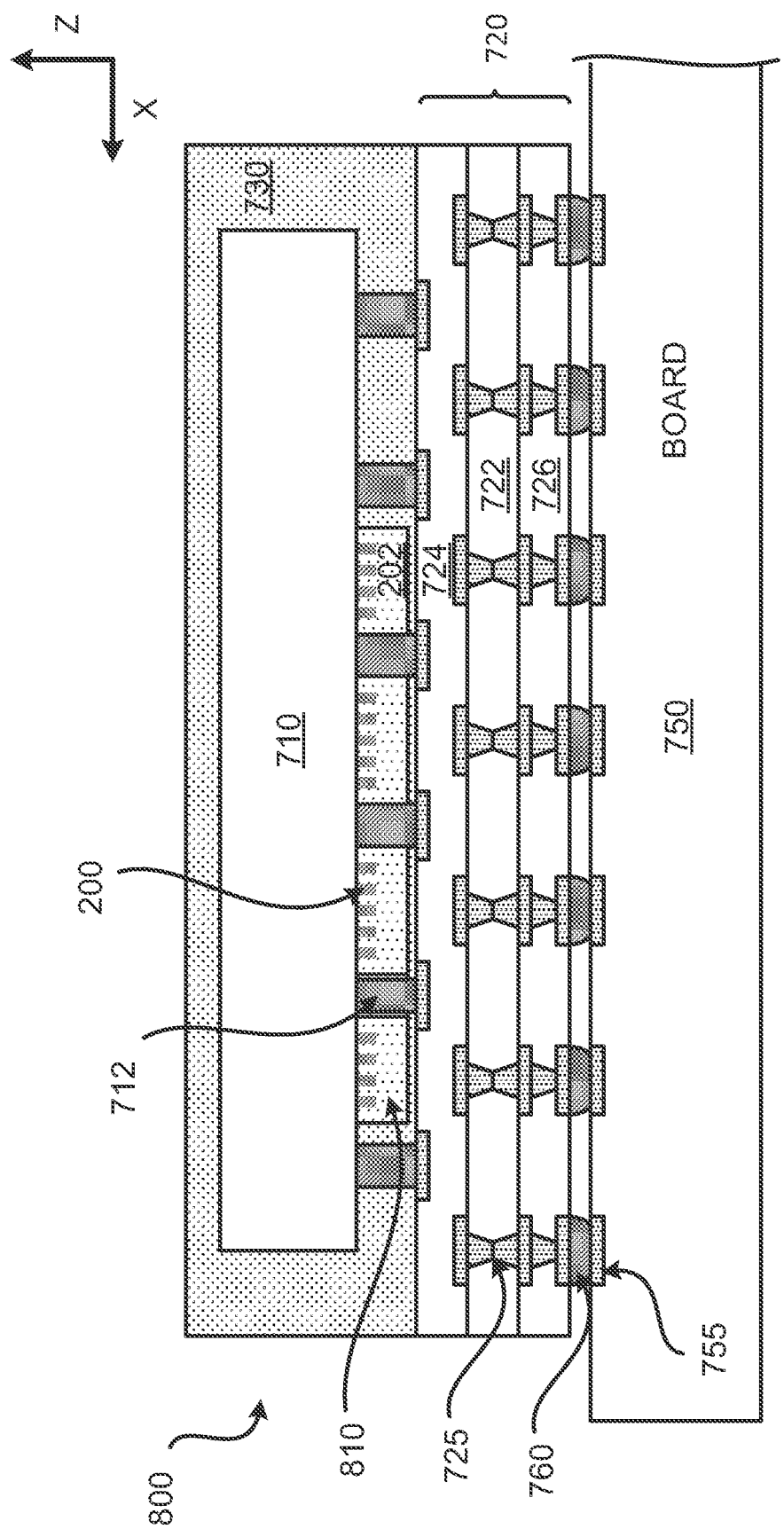
FIG. 8 illustrates a profile view of an exemplary package that includes a substrate comprising a plurality of trench capacitors.

FIG. 8 illustrates another example of a package 800 implemented with one or more trench capacitors. The package 800 may be similar to the package 700 of FIG. 7, and may include the same components as the package 700. The package 800 includes the integrated device 710, a capacitor structure 810, the substrate 720, and the encapsulation layer 730. The capacitor structure 810 may be similar to the capacitor structure 300 and/or capacitor structure 500, and may include the same components as the capacitor structure 300 and/or the capacitor structure 500. In the example of FIG. 8, the capacitor structure 810 has smaller lateral dimensions than the lateral dimensions of the integrated device 710. It is noted that in some implementations, a capacitor structure may have lateral dimensions that are greater than the lateral dimensions of the integrated device 710.

Figure 9:
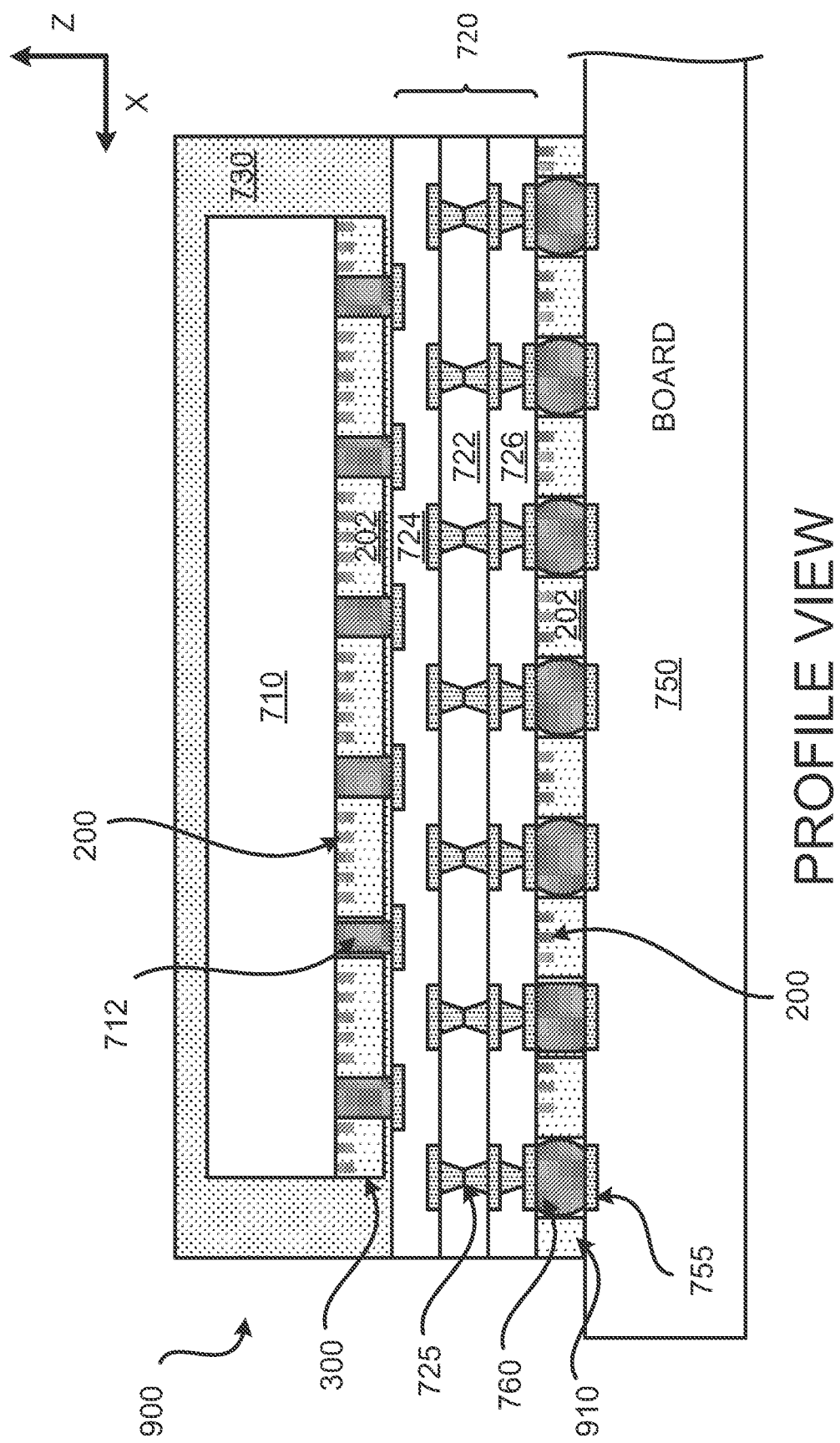
FIG. 9 illustrates a profile view of an exemplary package that includes a substrate comprising a plurality of trench capacitors.

FIG. 9 illustrates another example of a package 900 implemented with one or more trench capacitors. The package 900 may be similar to the package 700 of FIG. 7, and may include the same components as the package 700. The package 900 includes the integrated device 710, the capacitor structure 300, the substrate 720, and the encapsulation layer 730. The capacitor structure 300 may be a first capacitor structure.

FIG. 9 illustrates that the package 900 is coupled to the board 750 such that there is a capacitor structure 910 between the substrate 720 and the board 750. The capacitor structure 910 may be a second capacitor structure. The capacitor structure 910 may be similar to the capacitor structure 300 and/or the capacitor structure 500, and thus may include the same or similar components as the capacitor structure 300 and/or the capacitor structure 500. The plurality of solder interconnects 760 may travel through cavities of the capacitor structure 910. One solder interconnect 760 may be coupled to a contact layer (e.g., 418) of the capacitor structure 910. In some implementations, the capacitor structure 910 may be considered part of the package 900. In some implementations, the capacitor structure 910 may be considered a separate part of the package 900. The capacitor structure 910 may be implemented with a PDN circuit of the integrated device 710, and may help improve loop inductance in the PDN circuit.

Figure 10:
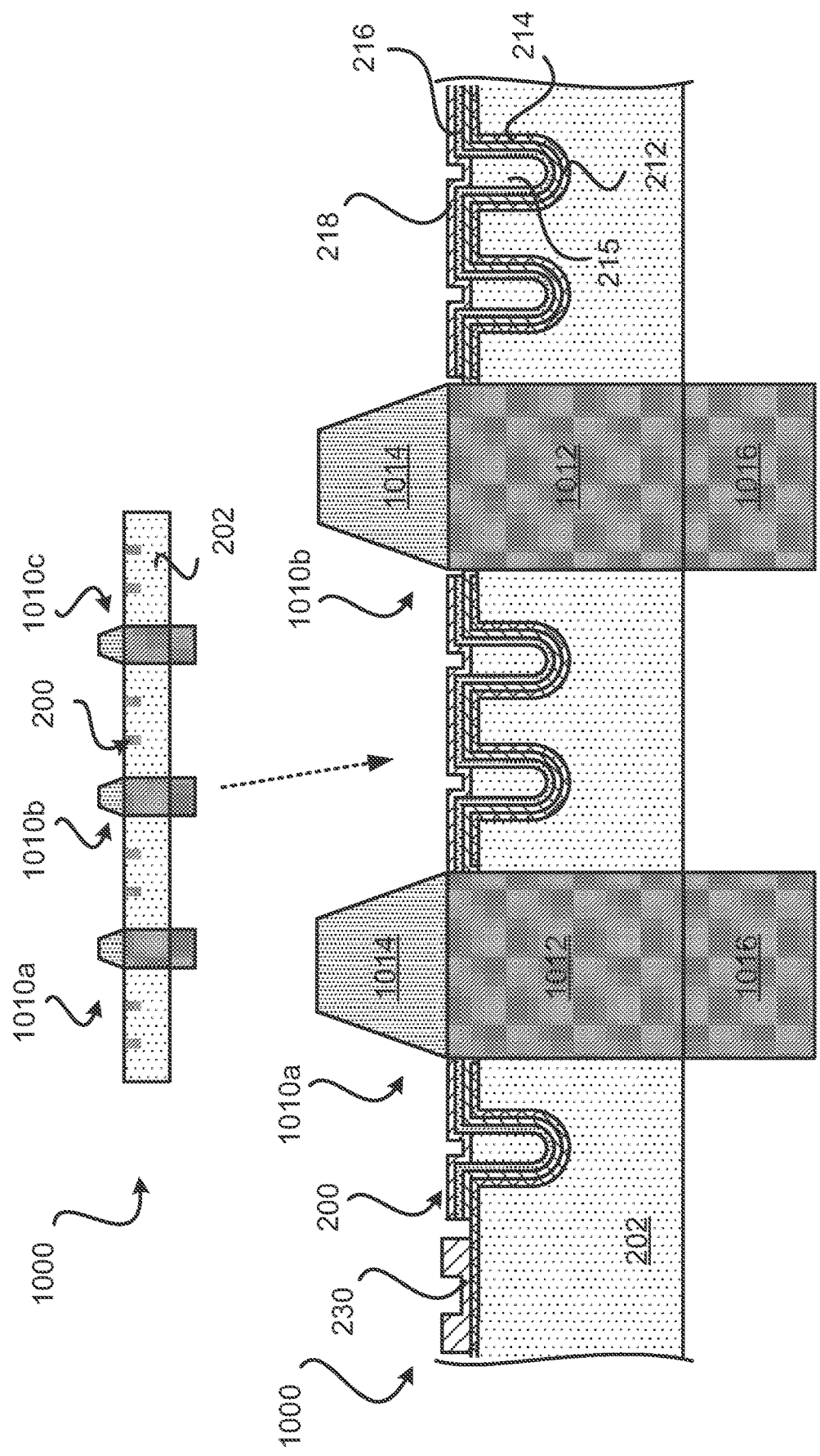
FIG. 10 illustrates a profile view of an exemplary substrate that includes a plurality of trench capacitors.

FIG. 10 illustrates another example of a capacitor structure 1000. The capacitor structure 1000 may be similar to the capacitor structure 300 and/or the capacitor structure 500, thus the capacitor structure 1000 may include the same or similar components as the capacitor structure 300 and/or the capacitor structure 500.

The capacitor structure 1000 includes the substrate 202, the first electrically conductive layer 212, the dielectric layer 214, the second electrically conductive layer 216, the filler 215, the second contact layer 218, and the first contact layer 230. The trench capacitor 200 may be defined by at least portions of the first electrically conductive layer 212, at least portions of the dielectric layer 214, and at least portions of the second electrically conductive layer 216. The capacitor structure 1000 may include several trench capacitors.

The capacitor structure 1000 further includes a plurality of interconnects 1010 (e.g., 1010a, 1010b, 1010c). Each interconnect from the plurality of interconnect 1010 may include several interconnects. For example, the interconnect 1010a may include an interconnect 1012 (e.g., pillar), an interconnect 1014 (e.g., micro bump) and an interconnect 1016 (e.g., pillar). In some implementations, the interconnect 1010a may be considered as one interconnect. The interconnect 1010a or portions of the interconnect 1010 may travel through the capacitor substrate 202.

Figure 11:
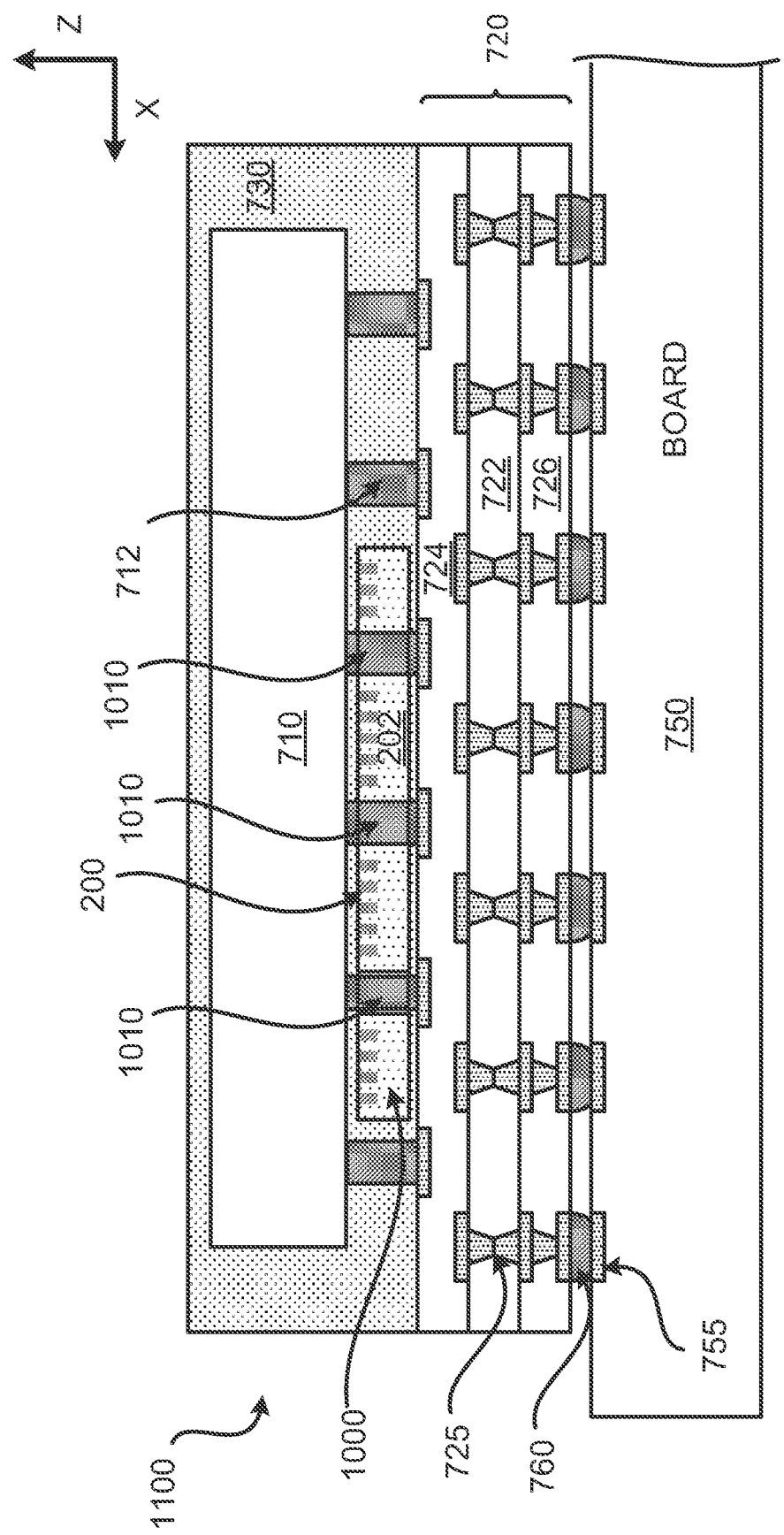
FIG. 11 illustrates a profile view of an exemplary package that includes a substrate comprising a plurality of trench capacitors.

FIG. 11 illustrates an example a package 1100 that includes a capacitor structure having one or more trench capacitors. The package 1100 may be similar to the package 700 of FIG. 7. The package 1100 includes the integrated device 710, the capacitor structure 1000, the substrate 720, and the encapsulation layer 730. As mentioned above, the capacitor structure 1000 includes a plurality of interconnects 1010 that travel through the capacitor substrate 202. The integrated device 710 is coupled to the substrate 720 through (i) a plurality of interconnects 712 and (ii) the plurality of interconnects 1010 of the capacitor structure 1000. The plurality of interconnects 712 includes pillars and/or solder interconnects. The capacitor structure 1000 is located between the substrate 720 and the integrated device 710. As shown in FIG. 11, at least some of the interconnects from the plurality of interconnects 712 may be surrounded by the encapsulation layer 730.

Having described various implementations of a package that includes a capacitor structure with trench capacitors, a sequence and a method for fabricating a capacitor structure that includes trench capacitors and fabricating a package that includes a capacitor structure with trench capacitors will now be described below.

Figure 12A:
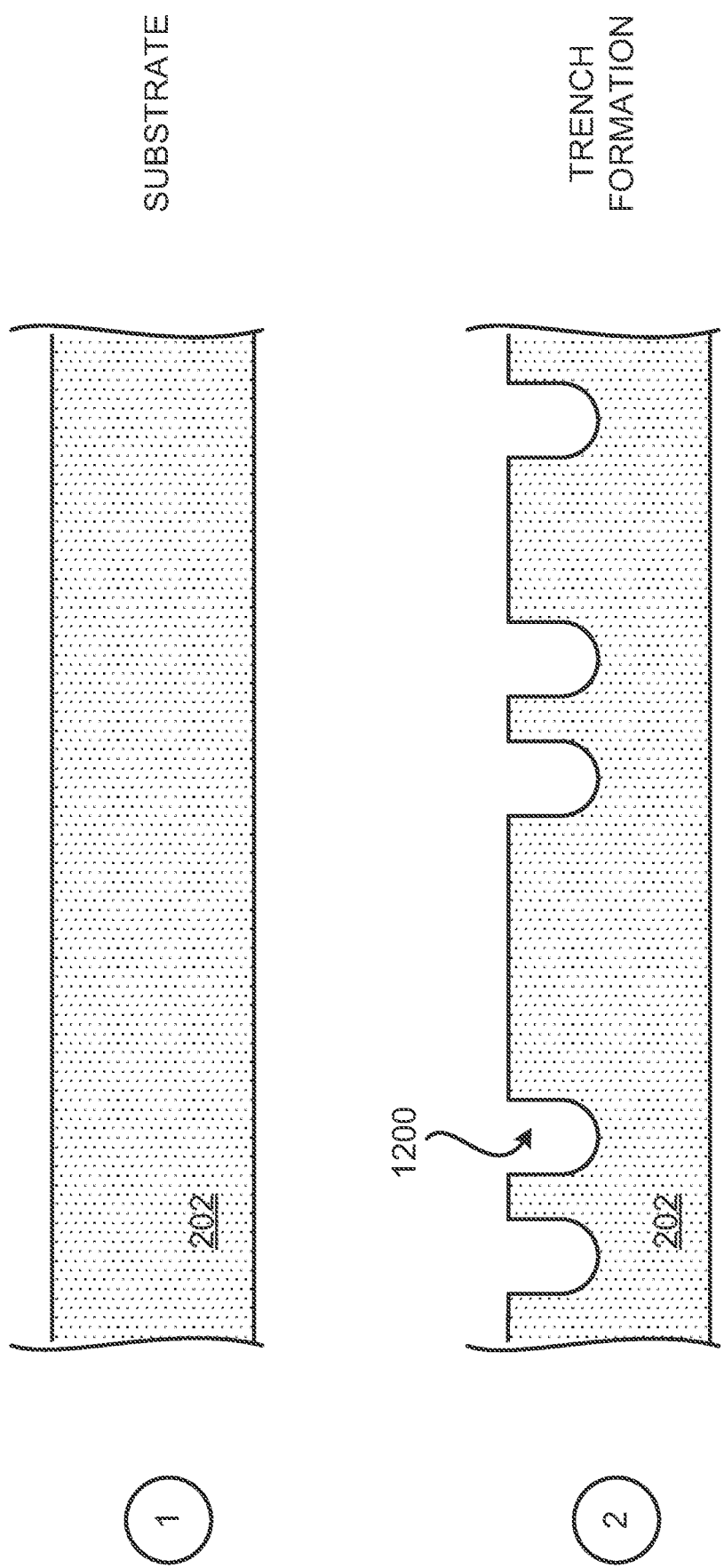
FIG. 12 (comprising FIGS. 12A-12D) illustrates an exemplary sequence for fabricating a substrate that includes a plurality of trench capacitors.
Figure 12D:
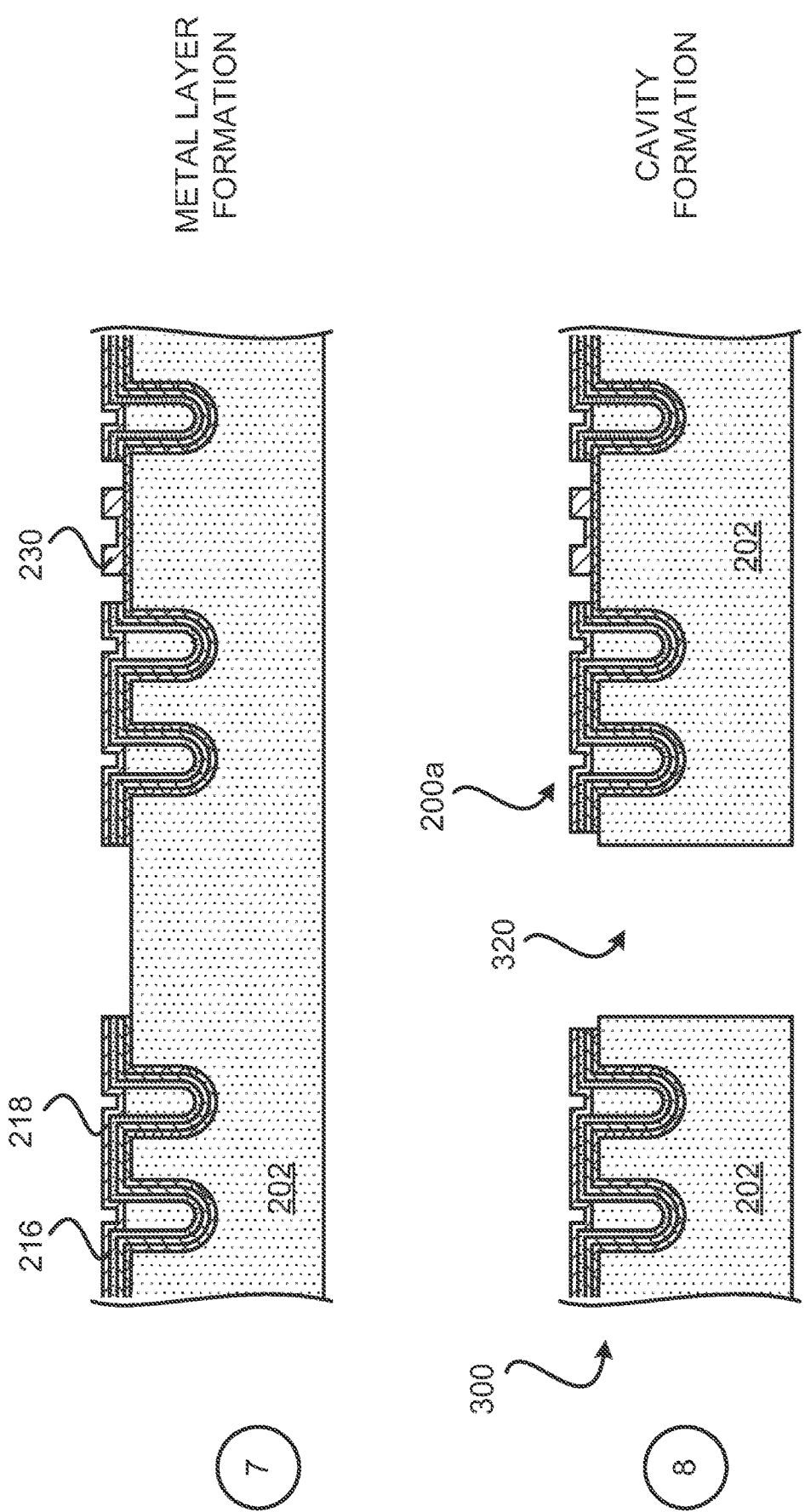

Exemplary Sequence for Fabricating a Capacitor Structure Comprising Trench Capacitors FIG. 12 (which includes FIGS. 12A-12D) illustrates an exemplary sequence for providing or fabricating a capacitor structure that includes a plurality of trench capacitors. In some implementations, the sequence of FIGS. 12A-12D may be used to provide or fabricate the capacitor structure 300 of FIG. 3, or any of the capacitor structures described in the disclosure.

It should be noted that the sequence of FIGS. 12A-12D may combine one or more stages in order to simplify and/or clarify the sequence for providing or fabricating the capacitor structure that includes a plurality of trench capacitors. In some implementations, the order of the processes may be changed or modified. In some implementations, one or more of processes may be replaced or substituted without departing from the spirit of the disclosure. However, different implementations may fabricate a capacitor structure differently.

Stage 1, as shown in FIG. 12A, illustrates a state after a substrate 202 is provided. The substrate 202 may be fabricated. The substrate 202 may include silicon (Si).

Stage 2 illustrates a state after a plurality of trenches 1200 is formed in the substrate 202. In particular, the plurality of trenches 1200 (e.g., first trench, second trench, third trench) is formed through a first surface of the substrate 202. Different implementations may form the trench differently. An etching process (e.g., chemical etching, mechanical etching) and/or a laser process may be used to form the trenches.

Stage 3, as shown in FIG. 12B, illustrates a state after a first electrically conductive layer 212 is formed (e.g., disposed) over the first surface of the substrate 202 and/or in the trenches 1200 of the substrate 202. A deposition process (e.g., chemical vapor deposition) may be used to form the first electrically conductive layer 212. In some implementations, the first electrically conductive layer 212 may include N+ silicon. Other implementations may use different materials and/or different combinations of materials as the first electrically conductive layer 212.

Stage 4 illustrates a state after the dielectric layer 214 is formed over the first electrically conductive layer 212. A deposition process may be used to form the dielectric layer 214 over the first electrically conductive layer 212. The dielectric layer 214 may be touching the first electrically conductive layer 212. At least a portion of the dielectric layer 214 may be formed in the plurality of trenches 1200. Some portions of the dielectric layer 214 may be located over the first surface of the substrate 202.

Stage 5, as shown in FIG. 12C, illustrates a state after a second electrically conductive layer 216 is formed (e.g., disposed) over the dielectric layer 214. The second electrically conductive layer 216 may be located over the first surface of the substrate 202 and/or in the trenches 1200 of the substrate 202. A deposition process (e.g., chemical vapor deposition) may be used to form the second electrically conductive layer 216. In some implementations, the second electrically conductive layer 216 may include N+ poly silicon. Other implementations may use different materials and/or different combinations of materials as the second electrically conductive layer 216.

Stage 6 illustrates a state after a filler 215 is formed over the second electrically conductive layer 216. The filler 215 may be formed in the trenches of the capacitor substrate 202. A deposition process may be used to form the filler 215 over the second electrically conductive layer 216. The filler 215 may be optional.

Stage 7, as shown in FIG. 12D, illustrates a state after the first contact layer 230 and the second contact layer 218 are formed. The first contact layer 230 may be formed over the first electrically conductive layer 212, and the second contact layer 218 may be formed over the second electrically conductive layer 216. The first contact layer 230 and the second contact layer 218 may be formed using a plating process (e.g., electro plating process).

Stage 8 illustrates a state after the cavity 320 is formed through the capacitor substrate 202. An etching process or a laser process may be used to form the cavity 320 through the capacitor substrate 202. In some implementations, Stage 8 may represent the capacitor structure 300.

Figure 13:
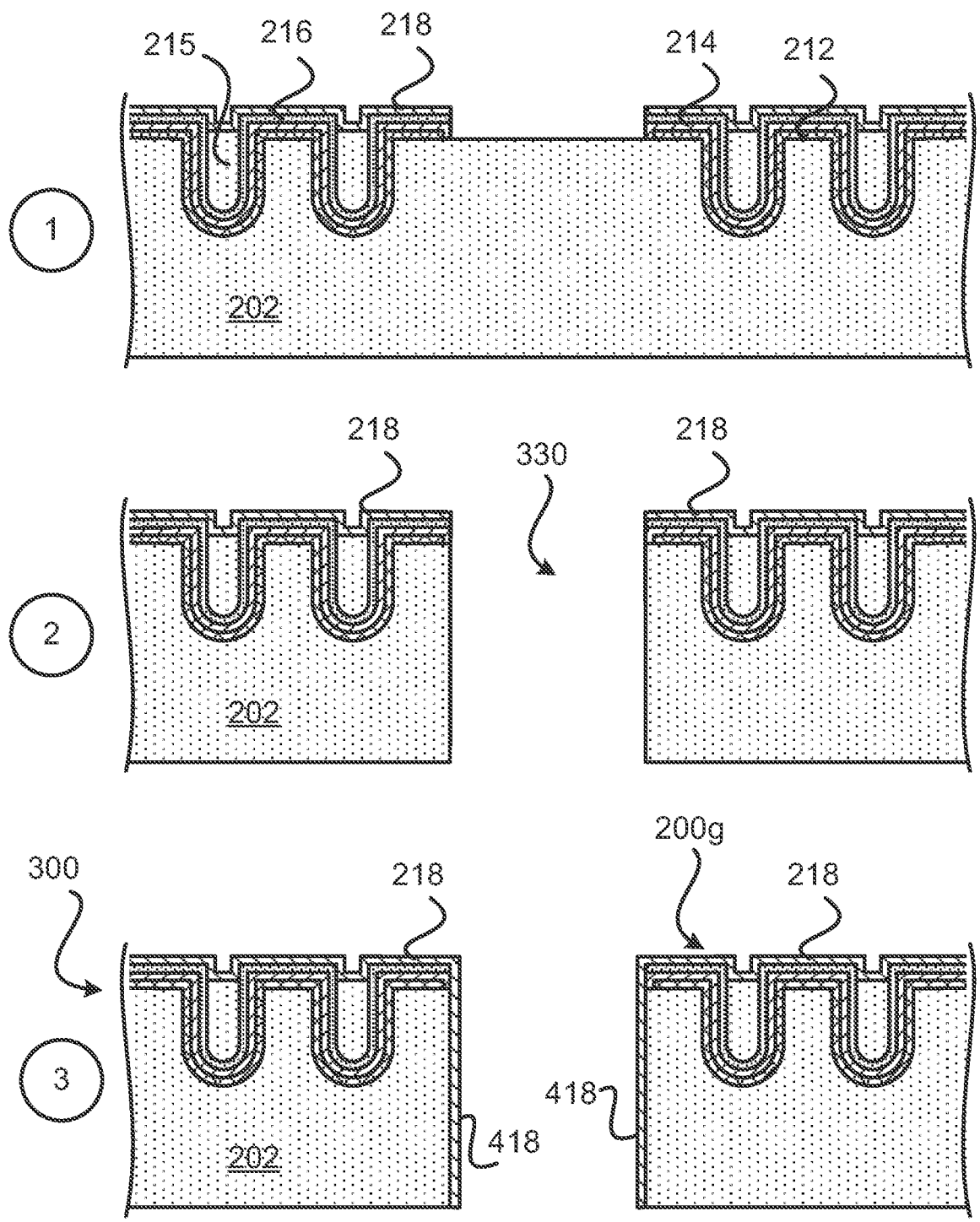
FIG. 13 illustrates an exemplary sequence for fabricating a substrate that includes a plurality of trench capacitors.

Exemplary Sequence for Fabricating a Capacitor Structure Comprising Trench Capacitors In some implementations, a side wall of a cavity of the capacitor substrate 202 may be covered with a metal layer. FIG. 13 illustrates an exemplary sequence for providing or fabricating a capacitor structure that includes a plurality of trench capacitors. In some implementations, the sequence of FIG. 13 may be used to provide or fabricate the capacitor structure 300 of FIG. 3, or any of the capacitor structures described in the disclosure.

It should be noted that the sequence of FIG. 13 may combine one or more stages in order to simplify and/or clarify the sequence for providing or fabricating the capacitor structure that includes a plurality of trench capacitors. In some implementations, the order of the processes may be changed or modified. In some implementations, one or more of processes may be replaced or substituted without departing from the spirit of the disclosure. However, different implementations may fabricate a capacitor structure differently.

Stage 1 of FIG. 13 illustrates a state after trench capacitors 200 are formed in and/or over the substrate 202. In some implementations, Stage 1 of FIG. 13 may correspond to Stage 7 of FIG. 12D. Thus, Stage 1 of FIG. 13 may represent a state after Stages 1-7 of FIG. 12A-12D.

Stage 2 illustrates a state after the cavity 330 is formed through the capacitor substrate 202. An etching process and/or a laser process may be used to form the cavity 330 through the capacitor substrate 202.

Stage 3 illustrates a state after the contact layer 418 is formed over the side wall of the cavity 330. In some implementations, a plating process (e.g., electro plating process) may be used to form the contact layer 418. The contact layer 418 may be coupled to the second contact layer 218. The contact layer 418 may be considered part of the second contact layer 218. Stage 3 may represent the capacitor structure 300.

Figure 14A:
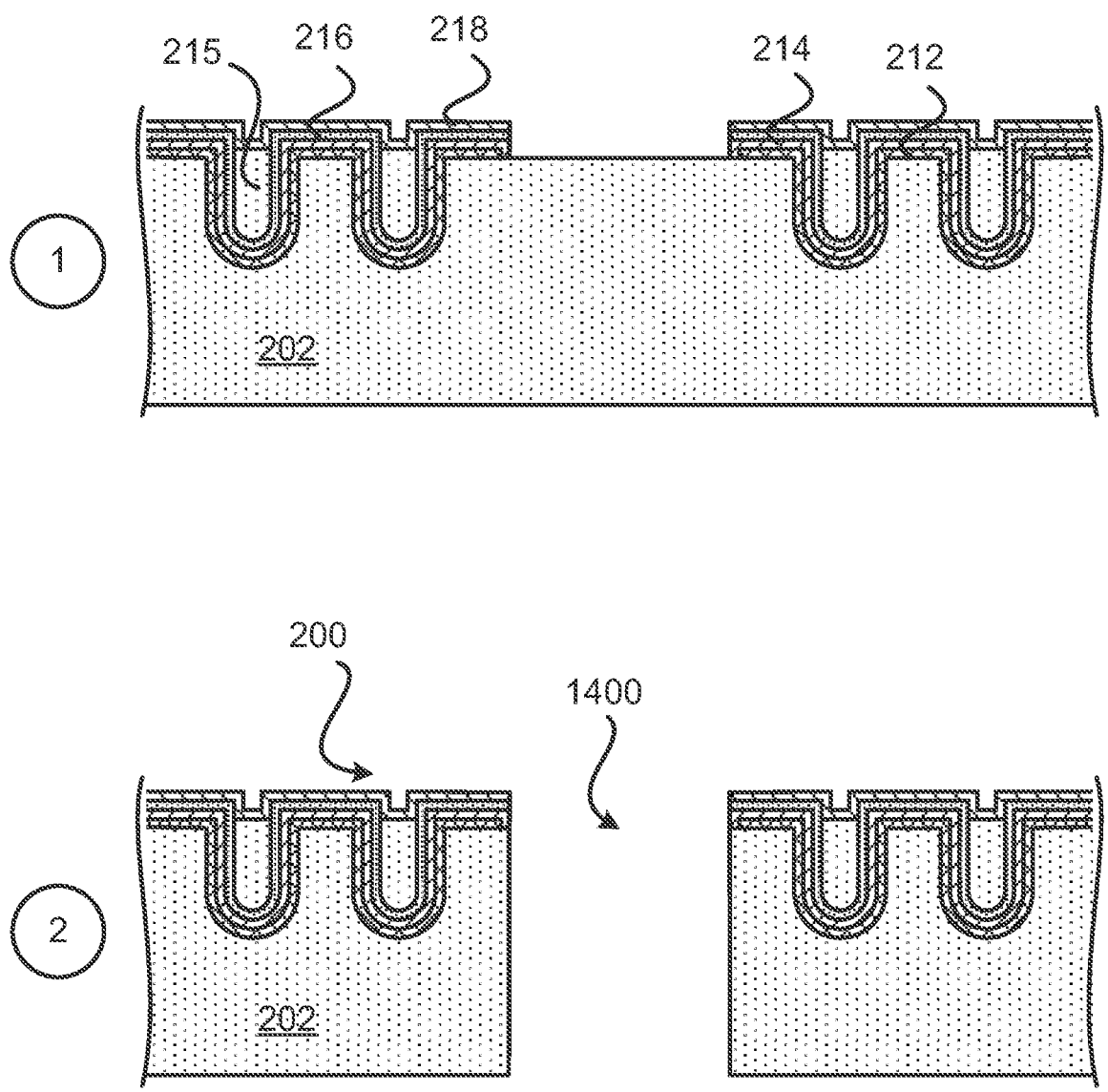
FIG. 14 (comprising FIGS. 14A-14B) illustrates an exemplary sequence for fabricating a substrate that includes a plurality of trench capacitors.
Figure 14B:
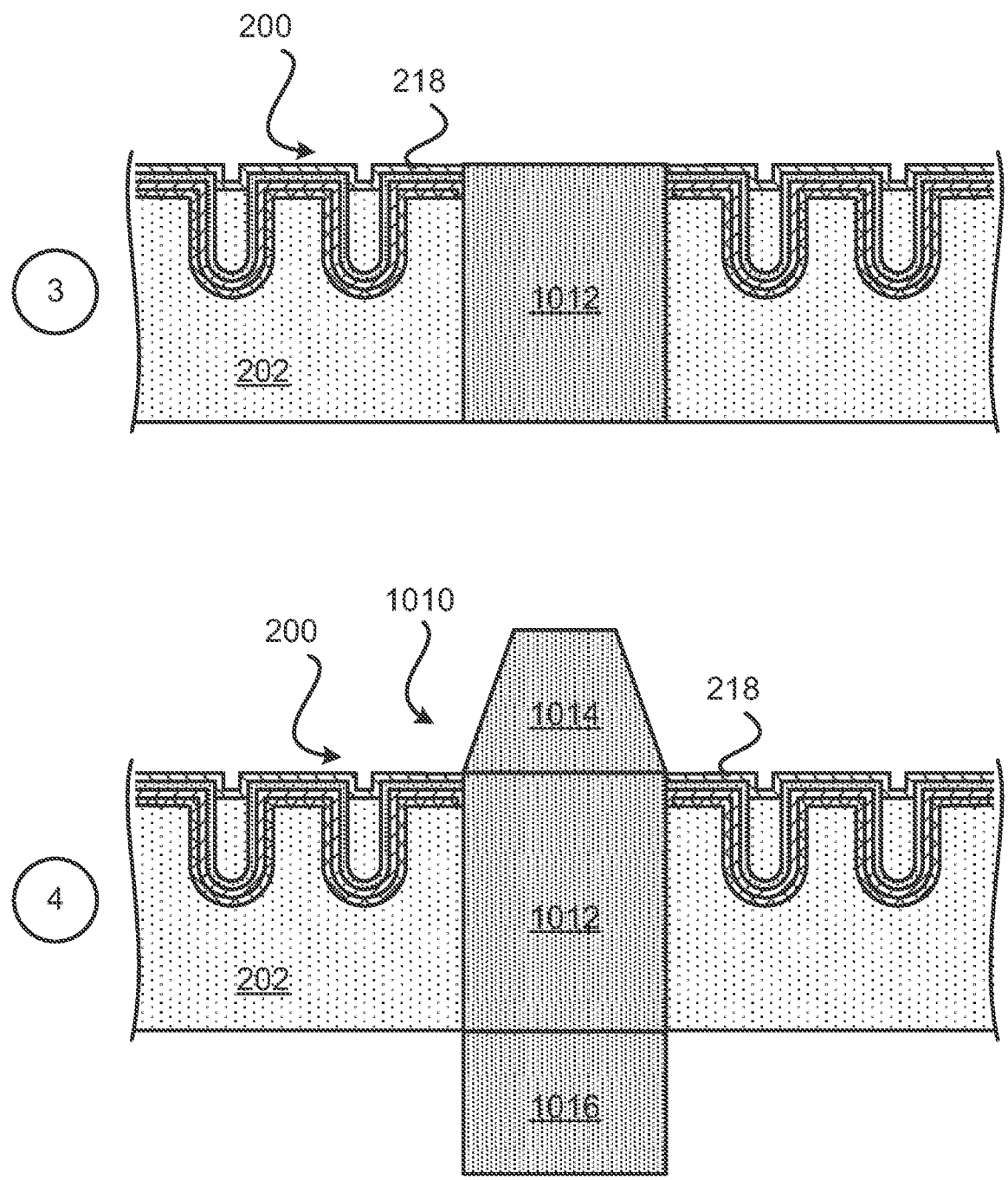

Exemplary Sequence for Fabricating a Capacitor Structure Comprising Trench Capacitors In some implementations, the cavity structure may cavities that are occupied with one or more interconnects. FIG. 14 (which includes FIGS. 14A-14B) illustrates an exemplary sequence for providing or fabricating a capacitor structure that includes a plurality of trench capacitors and interconnects in cavities. In some implementations, the sequence of FIG. 14 may be used to provide or fabricate the capacitor structure 1000 of FIG. 10, or any of the capacitor structures described in the disclosure.

It should be noted that the sequence of FIG. 14 may combine one or more stages in order to simplify and/or clarify the sequence for providing or fabricating the capacitor structure that includes a plurality of trench capacitors. In some implementations, the order of the processes may be changed or modified. In some implementations, one or more of processes may be replaced or substituted without departing from the spirit of the disclosure. However, different implementations may fabricate a capacitor structure differently.

Stage 1 of FIG. 14A illustrates a state after trench capacitors are formed in and/or over the substrate 202. In some implementations, Stage 1 of FIG. 14A may correspond to Stage 7 of FIG. 12D. Thus, Stage 1 of FIG. 14A may represent a state after Stages 1-7 of FIG. 12A-12D.

Stage 2 illustrates a state after the cavity 1400 is formed through the capacitor substrate 202. An etching process and/or a laser process may be used to form the cavity 1400 through the capacitor substrate 202.

Stage 3, as shown in FIG. 14B, illustrates a state after the interconnect 1012 is formed in the cavity 1400. In some implementations, a plating process (e.g., electro plating process) may be used to form the interconnect 1012. The interconnect 1012 may be coupled to the second contact layer 218, the first electrically conductive layer 212, or the second electrically conductive layer 216, depending on the design of the capacitor structure 1000.

Stage 4 illustrates a state after the interconnect 1014 and the interconnect 1016 are coupled to the interconnect 1012. The interconnect 1014 may be coupled to a first portion (e.g., top portion) of the interconnect 1012, and the interconnect 1016 may be coupled to a second portion (e.g., bottom portion) of the interconnect 1012. In some implementations, a plating process (e.g., electro plating process) may be used to form the interconnect 1014 and/or the interconnect 1016. In some implementations, the interconnect 1012, interconnect 1014, and the interconnect 1016 may define the interconnect 1010. The interconnect 1012, interconnect 1014, and the interconnect 1016 may be considered as one interconnect. The interconnect 1010 may be defined by one or more interconnects. Stage 4 may represent the capacitor structure 1000.

Figure 15:
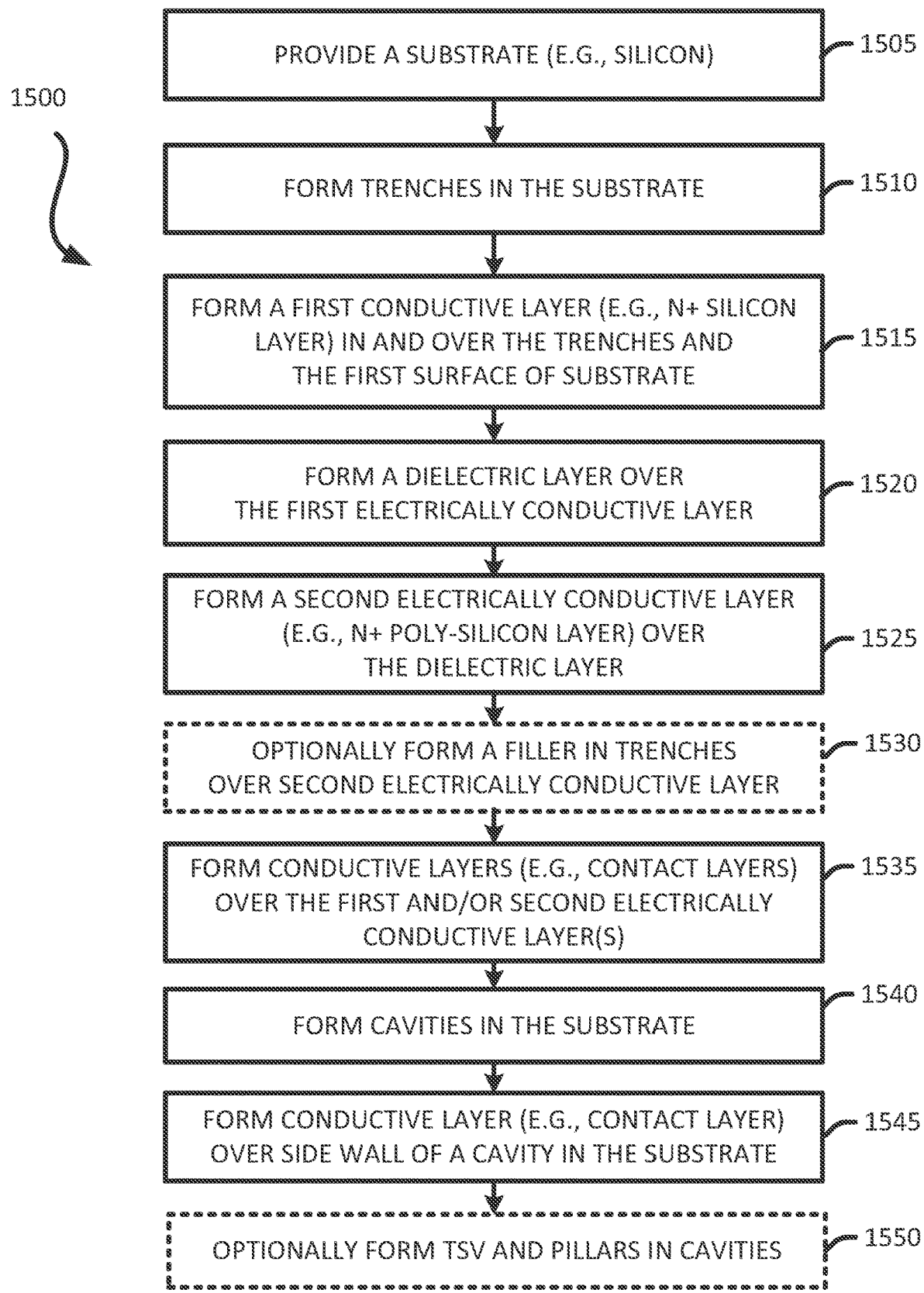
FIG. 15 illustrates an exemplary flow diagram of a method for fabricating a substrate that includes plurality of trench capacitors.

Exemplary Flow Diagram of a Method for Fabricating a Capacitor Structure Comprising Trench Capacitors In some implementations, fabricating a capacitor structure that includes a plurality of trench capacitors includes several processes. FIG. 15 illustrates an exemplary flow diagram of a method 1500 for providing or fabricating a capacitor structure that includes a plurality of trench capacitors. The method 1500 of FIG. 15 may be used to provide or fabricate the capacitor structure 300 of FIG. 3 described in the disclosure. However, the method 1500 may be used to provide or fabricate any of the capacitor structures described in the disclosure.

It should be noted that the sequence of FIG. 15 may combine one or more processes in order to simplify and/or clarify the method for providing or fabricating a capacitor structure. In some implementations, the order of the processes may be changed or modified. In some implementations, one or more of processes may be replaced or substituted without departing from the spirit of the disclosure. However, different implementations may fabricate a capacitor structure differently.

The method provides (at 1505) a substrate (e.g., 202). The substrate 202 may include silicon (Si). Stage 1 of FIG. 12A, illustrates a state after a substrate 202 is provided. The substrate 202 may be fabricated.

The method forms (at 1510) a plurality of trenches. Stage 2 of FIG. 12A illustrates a state after a plurality of trenches 1200 are formed in the substrate 202. In particular, the plurality of trenches 1200 (e.g., first trench, second trench, third trench) is formed through a first surface of the substrate 202. Different implementations may form the trench differently. An etching process (e.g., chemical etching, mechanical etching) and/or a laser process may be used to form the trenches.

The method forms (at 1515) a first electrically conductive layer over the trenches and/or the first surface of the substrate. Stage 3 of FIG. 12B, illustrates a state after a first electrically conductive layer 212 is formed (e.g., disposed) over the first surface of the substrate 202 and/or in the trenches 1200 of the substrate 202. A deposition process (e.g., chemical vapor deposition) may be used to form the first electrically conductive layer 212. In some implementations, the first electrically conductive layer 212 may include N+ silicon. Other implementations may use different materials as the first electrically conductive layer 212.

The method forms (at 1520) a dielectric layer over the first conductive layer. Stage 4 of FIG. 12B, illustrates a state after the dielectric layer 214 is formed over the first electrically conductive layer 212. A deposition process may be used to form the dielectric layer 214 over the first electrically conductive layer 212. The dielectric layer 214 may be touching the first electrically conductive layer 212. At least a portion of the dielectric layer 214 may be formed in the plurality of trenches 1200. Some portions of the dielectric layer 214 may be located over the first surface of the substrate 202.

The method forms (at 1525) a second electrically conductive layer over the dielectric layer. Stage 5 of FIG. 12C, illustrates a state after a second electrically conductive layer 216 is formed (e.g., disposed) over the dielectric layer 214. The second electrically conductive layer 216 may be located over the first surface of the substrate 202 and/or in the trenches 1200 of the substrate 202. A deposition process (e.g., chemical vapor deposition) may be used to form the second electrically conductive layer 216. In some implementations, the second electrically conductive layer 216 may include N+ poly silicon. Other implementations may use different materials as the second electrically conductive layer 216.

The method optionally forms (at 1530) a filler in the trenches over the second electrically conductive layer. Stage 6 of FIG. 12C illustrates a state after a filler 215 is formed over the second electrically conductive layer 216. The filler 215 may be formed in the trenches of the capacitor substrate 202. A deposition process may be used to form the filler 215 over the second electrically conductive layer 216.

The method forms (at 1535) first and second conductive layers (e.g., contact layers). Stage 7 of FIG. 12D, illustrates a state after the first contact layer 230 and the second contact layer 218 are formed. The first contact layer 230 may be formed over the first electrically conductive layer 212, and the second contact layer 218 may be formed over the second electrically conductive layer 216. The first contact layer 230 and the second contact layer 218 may be formed using a plating process (e.g., electro plating process).

The method forms (at 1540) cavities through the substrate. Stage 8 of FIG. 12 D, illustrates a state after the cavity 320 is formed through the capacitor substrate 202. An etching process or a laser process may be used to form the cavity 320 through the capacitor substrate 202. Stage 2 of FIG. 13, illustrates a state after the cavity 330 is formed through the capacitor substrate 202. An etching process and/or a laser process may be used to form the cavity 330 through the capacitor substrate 202.

The method forms (at 1545) conductive layer over the side wall of a cavity of the substrate. Stage 3 of FIG. 13, illustrates a state after the contact layer 418 is formed over the side wall of the cavity 330 of the substrate 202. In some implementations, a plating process (e.g., electro plating process) may be used to form the contact layer 418. The contact layer 418 may be coupled to the second contact layer 218. The contact layer 418 may be considered part of the second contact layer 218.

The method forms (at 1550) interconnects in one or more cavities (e.g., 320, 330, 1400) of the substrate 202. Stages 3 and 4 of FIG. 14B, illustrate examples of forming interconnects (e.g., 1010) that travel through the cavities of a substrate.

Exemplary Sequence for Fabricating a Package that Includes an Integrated Device and a Capacitor Structure Comprising Trench Capacitors FIG. 16 (which includes FIGS. 16A-16D) illustrates an exemplary sequence for providing or fabricating a package that includes a capacitor structure comprising trench capacitors. In some implementations, the sequence of FIGS. 16A-16D may be used to provide or fabricate the package 900 of FIG. 9, or any of the packages described in the disclosure.

It should be noted that the sequence of FIGS. 16A-16D may combine one or more stages in order to simplify and/or clarify the sequence for providing or fabricating the package that includes a capacitor structure comprising trench capacitors. In some implementations, the order of the processes may be changed or modified. In some implementations, one or more of processes may be replaced or substituted without departing from the spirit of the disclosure. However, different implementations may fabricate a package differently.

Figure 16A:
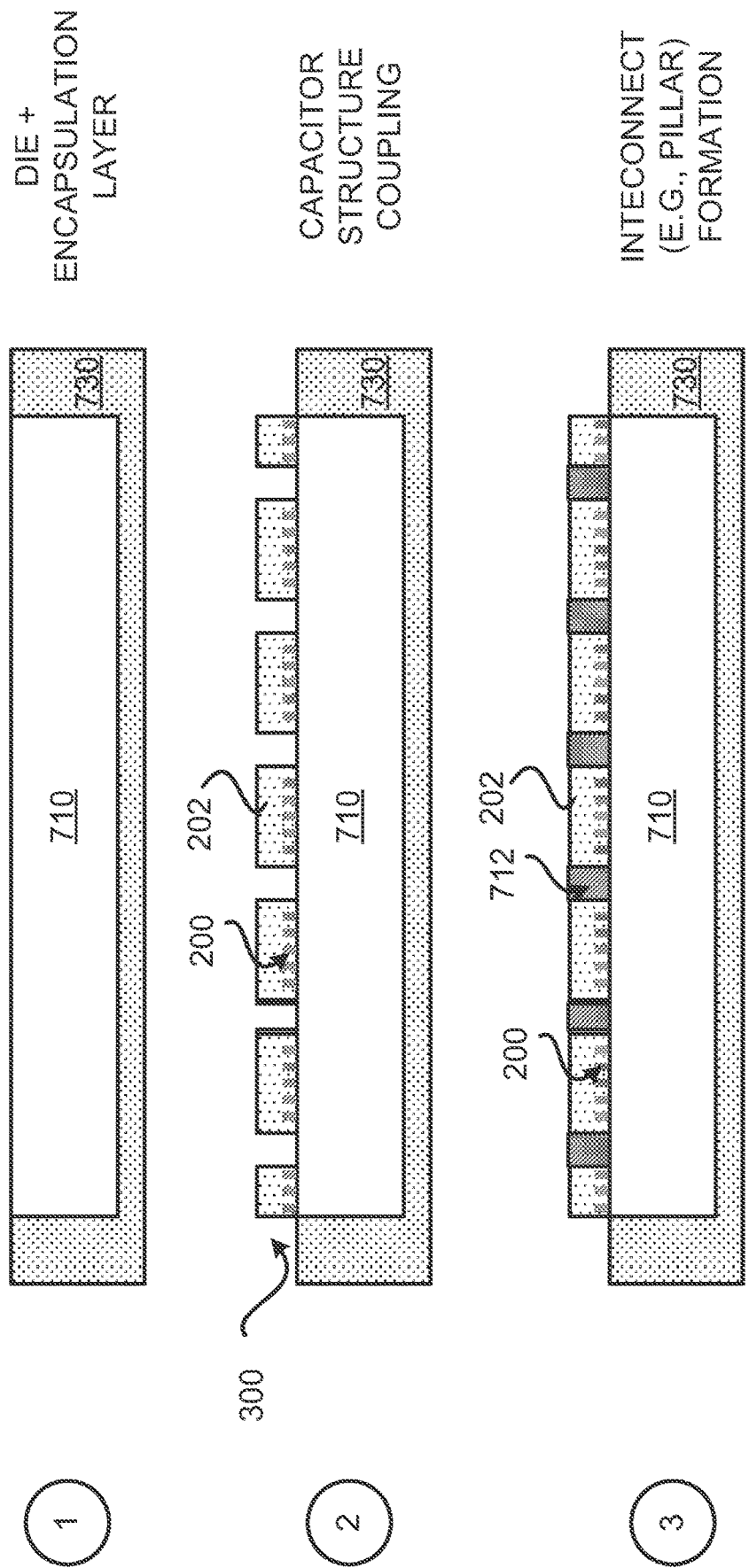
FIG. 16 (comprising FIGS. 16A-16D) illustrates an exemplary sequence for fabricating a package that includes a substrate comprising a plurality of trench capacitors.

Stage 1, as shown in FIG. 16A, illustrates a state after an integrated device 710 and an encapsulation layer 730 are provided. The encapsulation layer 730 may encapsulate portions of the integrated device 710. A compression and transfer molding process, a sheet molding process, or a liquid molding process to provide and form the encapsulation layer 730 around the integrated device 710.

Stage 2 illustrates a state after the capacitor structure 300 is coupled to the integrated device 710. The capacitor structure 300 may be picked and placed over a front side (e.g., active side) of the integrated device 710. The capacitor structure 300 may be a first capacitor structure.

Stage 3 illustrates a state after the plurality of interconnects 712 is formed in the cavities (e.g., 320, 330) of the capacitor structure 300. A plating process may be used to form the plurality of interconnects 712. However, other processes may be used to form the plurality of interconnects 712.

Figure 16B:
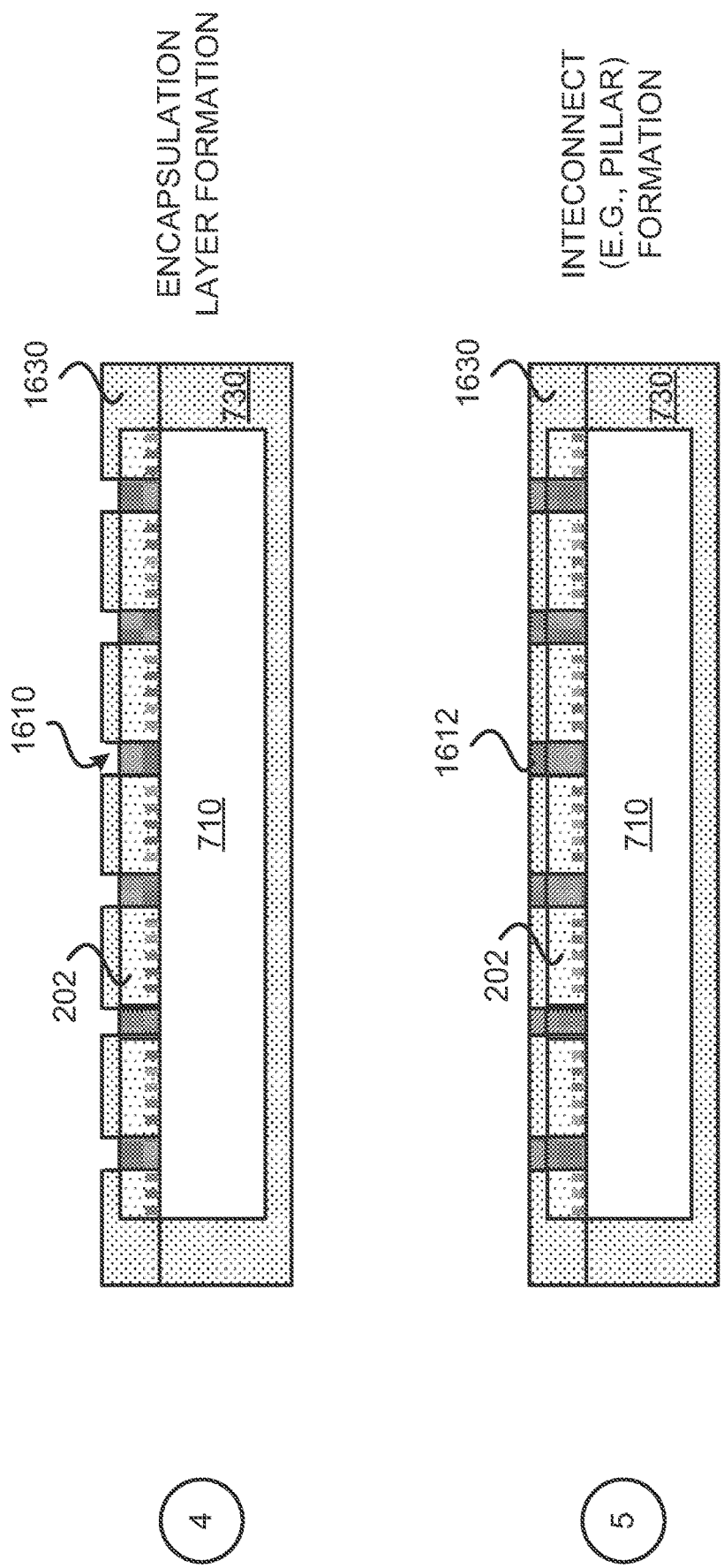

Stage 4, as shown in FIG. 16B, illustrates a state after an encapsulation layer 1630 are formed over the encapsulation layer 730. One or more openings 1610 may be present over the plurality of interconnects 712. A compression and transfer molding process, a sheet molding process, or a liquid molding process to provide and form the encapsulation layer 730 around the integrated device 710.

Stage 5 illustrates a state after a plurality of interconnects 1612 is formed over the plurality of interconnects 712. A plating process may be used to form the plurality of interconnects 1612. In some implementations, the plurality of interconnects 1612 may be considered part of the plurality of interconnects 712.

Figure 16C:
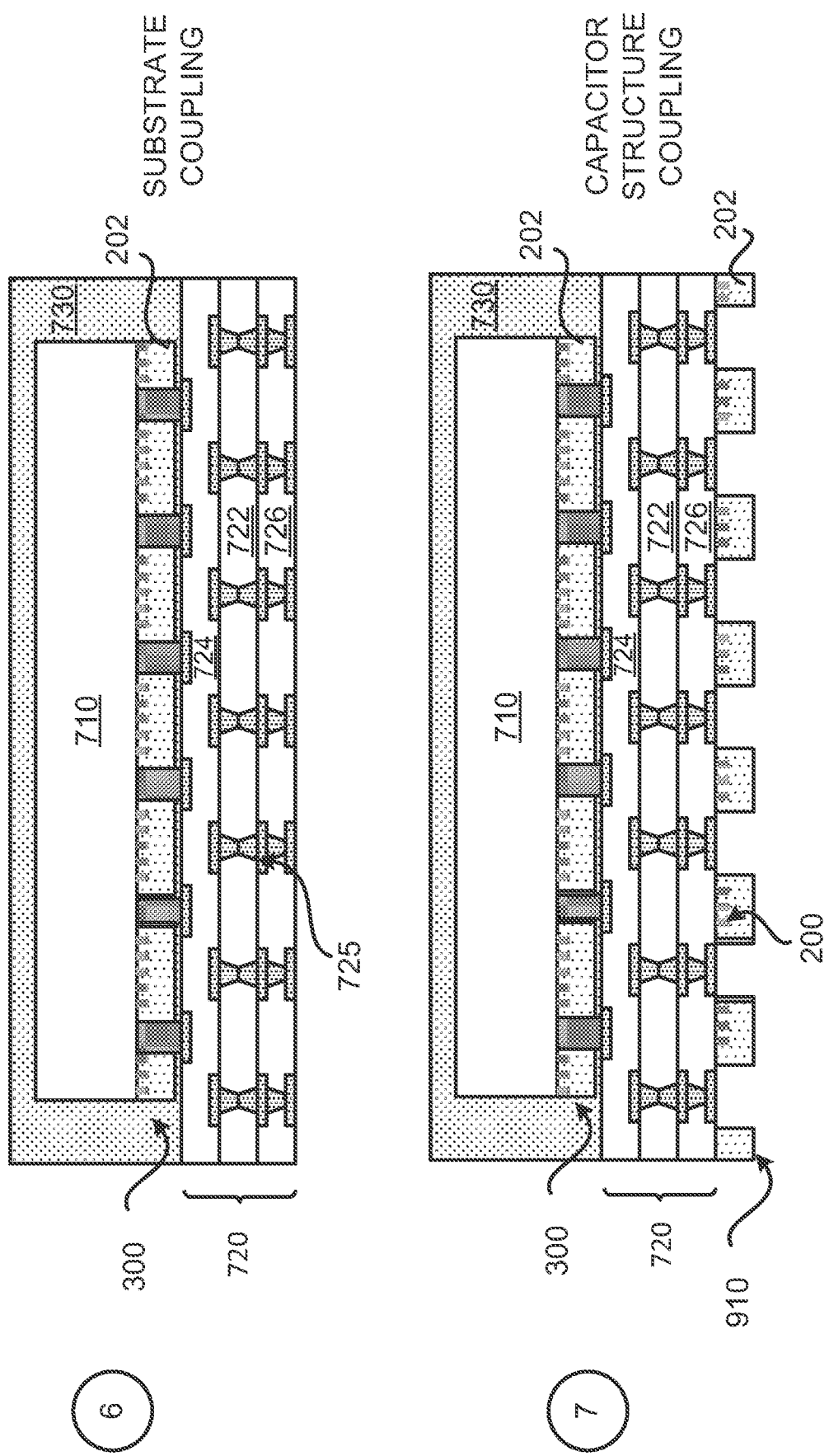

Stage 6, as shown in FIG. 16C, illustrates a state after the integrated device 710, the capacitor structure 300 and the encapsulation layer 730 are coupled to the substrate 720 (e.g., coupled to a first surface of substrate 720). A plurality of solder interconnects may be used to couple the plurality of interconnects 712 to the plurality of interconnects 725 of the substrate 720. In some implementations, the substrate 720 may be formed over the capacitor structure 300 and the encapsulation layer 730. Forming the substrate 720 may include several deposition processes, several plating processes, and/or several etching processes. However, different implementations may form or couple the substrate 720 differently.

Stage 7 illustrates a state after the capacitor structure 910 is coupled to a second surface of the substrate 720. The capacitor structure 910 may be picked and placed over the second surface of the substrate 720. The capacitor structure 910 may be a second capacitor structure. The capacitor structure 910 may include a substrate 202 and a plurality of trench capacitors 200.

Figure 16D:
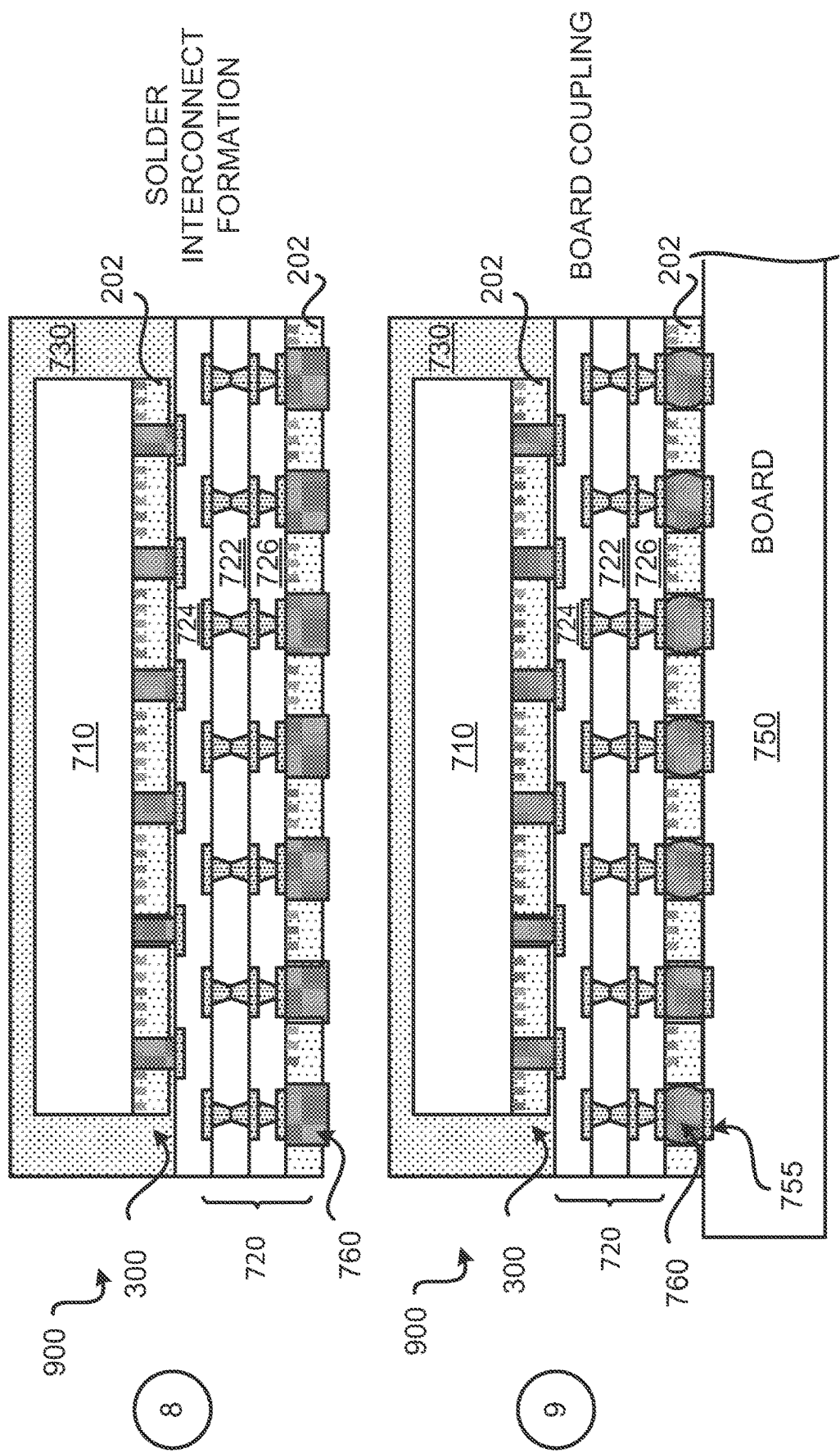

Stage 8, as shown in FIG. 16D, illustrates a state after the plurality of solder interconnects 760 is formed in the cavities (e.g., 320, 330) of the capacitor structure 910. A pasting process may be used to form the plurality of solder interconnects 760. However, other processes may be used to form the plurality of solder interconnects 760.

Stage 9 illustrates a state after substrate 720 of the package 900 is coupled to the board 750 through the plurality of solder interconnects 760. The plurality of solder interconnects 760 may be coupled to the plurality of interconnects 725 and the plurality of interconnects 755.

Figure 17B:
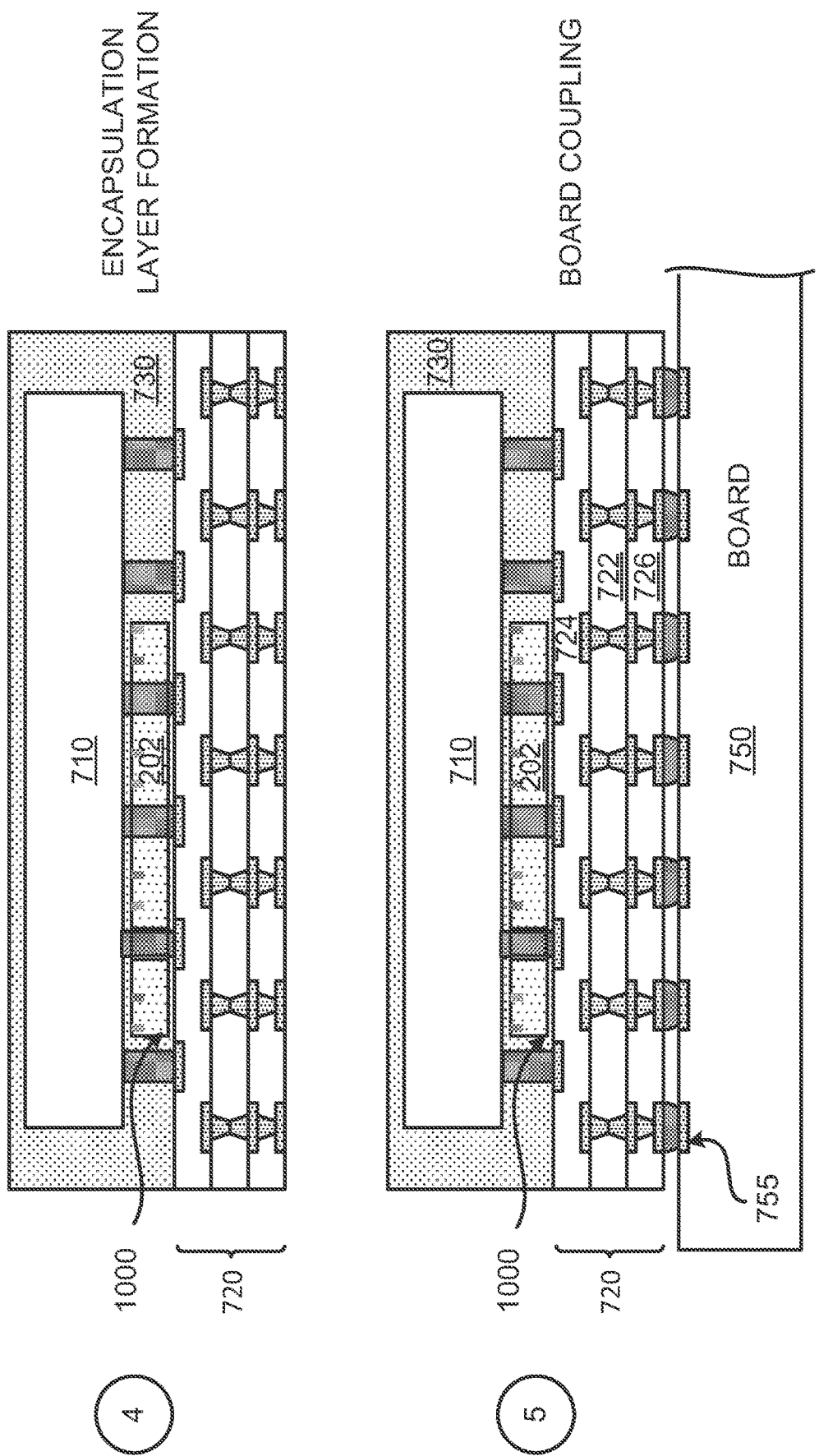
FIG. 17 (comprising FIGS. 17A-17B) illustrates an exemplary sequence for fabricating a package that includes a substrate comprising a plurality of trench capacitors.

Exemplary Sequence for Fabricating a Package that Includes an Integrated Device and a Capacitor Structure Comprising Trench Capacitors FIG. 17 (which includes FIGS. 17A-17B) illustrates an exemplary sequence for providing or fabricating a package that includes a capacitor structure comprising trench capacitors. In some implementations, the sequence of FIGS. 17A-17B may be used to provide or fabricate the package 1100 of FIG. 11, or any of the packages described in the disclosure.

It should be noted that the sequence of FIGS. 17A-17B may combine one or more stages in order to simplify and/or clarify the sequence for providing or fabricating the package that includes a capacitor structure comprising trench capacitors. In some implementations, the order of the processes may be changed or modified. In some implementations, one or more of processes may be replaced or substituted without departing from the spirit of the disclosure. However, different implementations may fabricate a package differently.

Stage 1, as shown in FIG. 17A, illustrates a state after an integrated device 710 is provided. The integrated device 710 includes the plurality of interconnects 712. The integrated device 710 may include a die.

Stage 2 illustrates a state after the capacitor structure 1000 is coupled to the integrated device 710. The capacitor structure 300 may be picked and placed over a front side (e.g., active side) of the integrated device 710. The capacitor structure 1000 may be a first capacitor structure. The interconnects of the capacitor structure 1000 may be coupled directly to interconnects of the integrated device 710 and/or may be coupled through solder interconnects.

Stage 3 illustrates a state after the integrated device 710 and the capacitor structure 1000 are coupled to the substrate 720 (e.g., coupled to a first surface of substrate 720). A plurality of solder interconnects may be used to couple the plurality of interconnects 712 to the plurality of interconnects 725 of the substrate 720.

Stage 4, as shown in FIG. 17B, illustrates a state after the encapsulation layer 730 is formed over the substrate 720 such that the encapsulation layer 730 encapsulates the integrated device 710. The encapsulation layer 730 may also encapsulate the capacitor structure 1000. A compression and transfer molding process, a sheet molding process, or a liquid molding process to provide and form the encapsulation layer 730 around the integrated device 710.

Stage 5 illustrates a state after substrate 720 of the package 1100 is coupled to the board 750 through the plurality of solder interconnects 760. The plurality of solder interconnects 760 may be coupled to the plurality of interconnects 725 and the plurality of interconnects 755. Stage 5 may illustrate the package 1100 of FIG. 11. In some implementations, a second capacitor structure (e.g., 910) may be located between the substrate 720 and the board 750.

Figure 18:
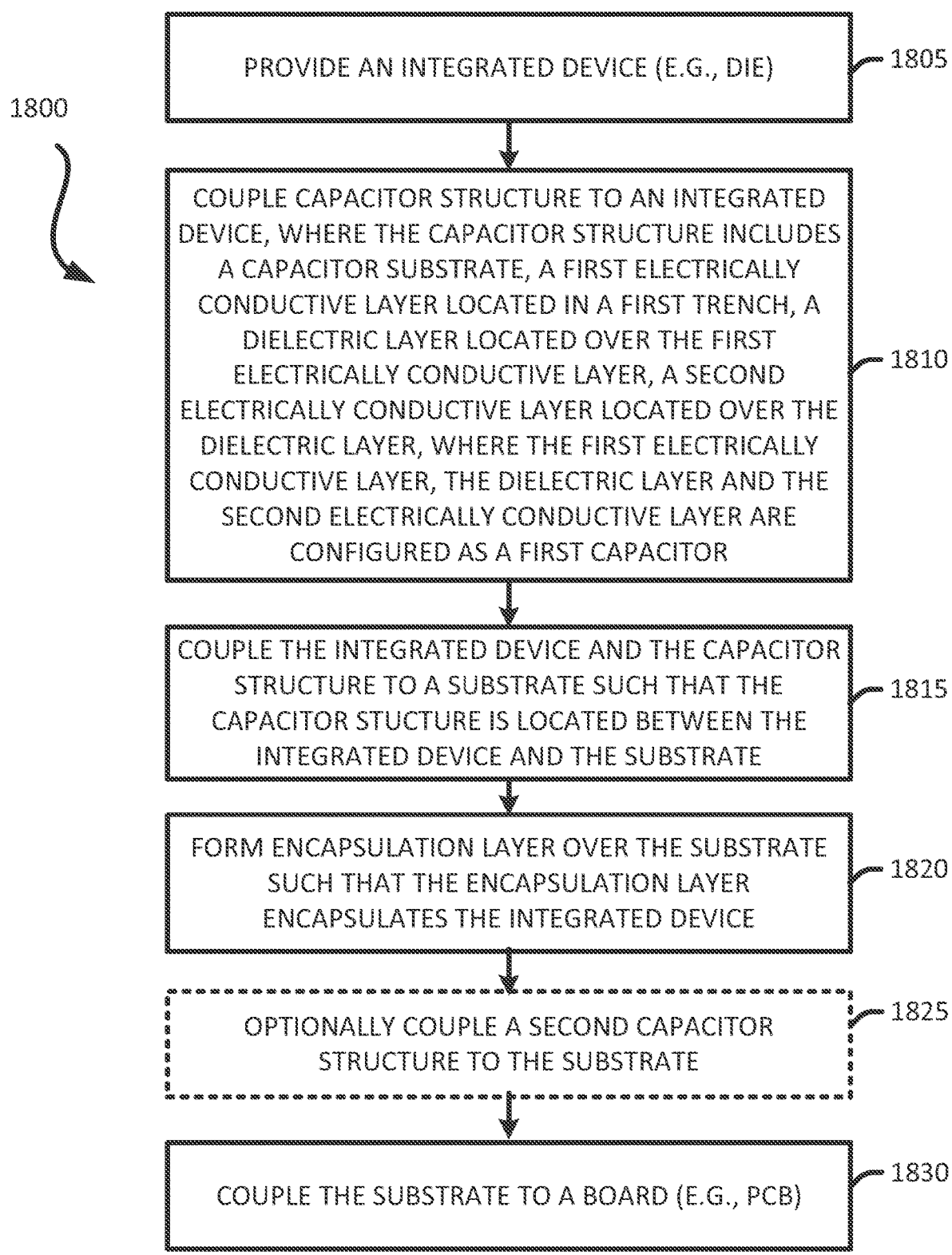
FIG. 18 illustrates an exemplary flow diagram of a method for fabricating a package that includes a substrate comprising a plurality of trench capacitors.

Exemplary Flow Diagram of a Method for Fabricating a Package that Includes an Integrated Device and a Capacitor Structure Comprising Trench Capacitors In some implementations, fabricating a package that includes a capacitor structure comprising trench capacitors. FIG. 18 illustrates an exemplary flow diagram of a method 1800 for providing or fabricating a package that includes a capacitor structure comprising trench capacitors. The method 1800 of FIG. 18 may be used to provide or fabricate the package 900 of FIG. 9 described in the disclosure. However, the method 1800 may be used to provide or fabricate any of the packages described in the disclosure.

It should be noted that the sequence of FIG. 18 may combine one or more processes in order to simplify and/or clarify the method for providing or fabricating a package that includes a capacitor structure comprising trench capacitors. In some implementations, the order of the processes may be changed or modified. In some implementations, one or more of processes may be replaced or substituted without departing from the spirit of the disclosure. However, different implementations may fabricate packages differently.

The method provides (at 1805) an integrated device (e.g., 710). Stage 1 of FIG. 16A and Stage 1 of FIG. 17A illustrates an example of an integrated device being provided.

The method couples (at 1810) a capacitor structure (e.g., 300, 1000) to the integrated device. Stage 2 of FIG. 16A and Stage 2 of FIG. 17A illustrates an example of a capacitor structure coupled to an integrated device. The capacitor substrate may include a first electrically conductive layer 212 located in the first trench, a dielectric layer 214 located over the first electrically conductive layer 212, and a second electrically conductive layer 216 located over the dielectric layer 214. The first electrically conductive layer 212 over the first trench, the dielectric layer 214 and the second electrically conductive layer 216 may be a configured as a first capacitor (e.g., first trench capacitor).

The method couples (at 1815) the integrated device and the capacitor structure to the substrate (e.g., 720). Stage 8 of FIG. 16C and Stage 3 of FIG. 17A illustrate examples of an integrated device and a capacitor structure coupled to substrate. The integrated device 710 may be coupled to the substrate 720 such that the capacitor structure (e.g., 300, 1000) is located between the substrate 720 and the integrated device 710.

The method forms (at 1820) forms an encapsulation layer (e.g., 730) over the substrate 720 such that the encapsulation layer encapsulates the integrated device (e.g., 710). The encapsulation layer may also encapsulate and/or surround the capacitor structure (e.g., 300, 1000). Stage 4 of FIG. 17B illustrates an example of an encapsulation layer formed over a substrate and encapsulating an integrated device and a capacitor structure.

The method may optionally couple (at 1825) a second capacitor structure (e.g., 910) to a second surface of the substrate (e.g., 720). Stage 7 of FIG. 16C illustrates an example of a second capacitor structure (e.g., 910) coupled to second surface (e.g., bottom surface) of a substrate.

The method couples (at 1830) the substrate (e.g., 720) to a board 750. The substrate 720 may be coupled to the board 750 through a plurality of solder interconnects 760. Stage 9 of FIG. 16D and Stage 5 of FIG. 17B illustrate examples of a substrate 720 (of a package) being coupled to the board 750 through the plurality of solder interconnects 760. It is noted that the substrate 720 may be coupled to the board 750 differently. Both Stage 9 of FIG. 16D and Stage 5 of FIG. 17B illustrate examples of a package coupled to the board 750 through the plurality of solder interconnects 760.

Exemplary Electronic Devices

Figure 19:
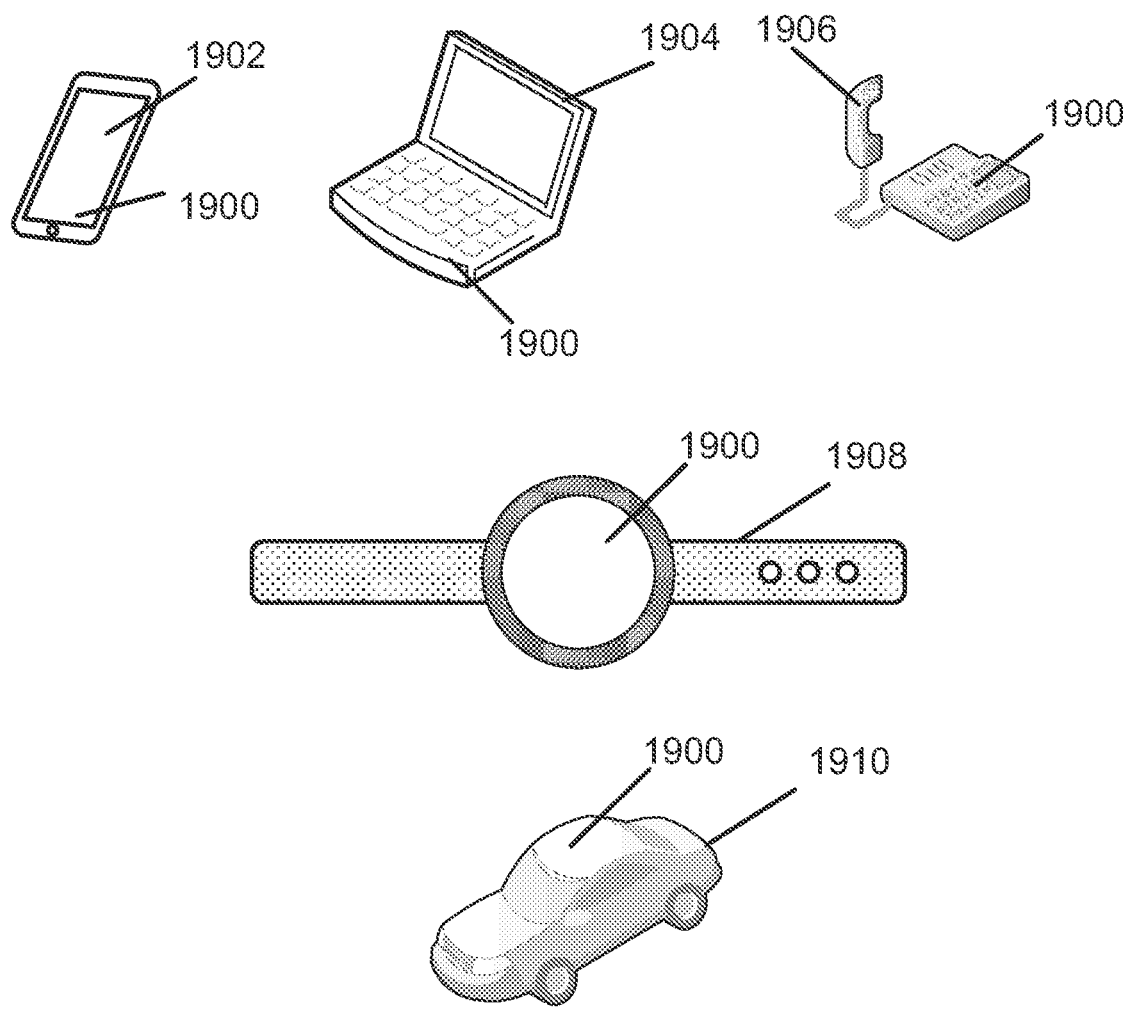
FIG. 19 illustrates various electronic devices that may integrate a die, an integrated device, an integrated passive device (IPD), a passive component, a package, and/or a device package described herein.

FIG. 19 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1902, a laptop computer device 1904, a fixed location terminal device 1906, a wearable device 1908 or automotive vehicle 1910 may include a device 1900 as described herein. The device 1900 may be, for example, any of the devices and/or packages described herein. The electronic devices 1902, 1904, 1906 and 1908 and the vehicle 1910 illustrated in FIG. 19 are merely exemplary. Other electronic devices may also feature the device 1900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-11, 12A-12D, 13, 14A-14B, 15, 16A-16D, 17A-17B, and/or 18-19 may be rearranged and/or combined into a single component, process, feature or function or embodied in several components, processes, or functions. Additional elements, components, processes, and/or functions may also be added without departing from the disclosure. It should also be noted FIGS. 2-11, 12A-12D, 13, 14A-14B, 15, 16A-16D, 17A-17B, and/or 18-19 and its corresponding description in the present disclosure is not limited to dies and/or ICs. In some implementations, FIGS. 2-11, 12A-12D, 13, 14A-14B, 15, 16A-16D, 17A-17B, and/or 18-19 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that the object may partially encapsulate or completely encapsulate another object. The use of the terms "first", "second", "third" and "fourth" (and/or anything above fourth) is arbitrary. Any of the components described may be the first, second, third or fourth. For example, a component that is referred to a second component, may be the first component, the second component, the third component or the fourth component. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect includes an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects. The process of forming and/or disposing an encapsulation layer may include using a compression and transfer molding process, a sheet molding process, or a liquid molding process.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a substrate;
   an integrated device coupled to the substrate; and
   a capacitor structure located between the substrate and the integrated device, the capacitor structure comprising:
      a capacitor substrate comprising a first trench;
      a first electrically conductive layer located in the first trench;
      a dielectric layer located over the first electrically conductive layer; and
      a second electrically conductive layer located over the dielectric layer,
      wherein the first electrically conductive layer located in the first trench, the dielectric layer and the second electrically conductive layer, are configured as a first capacitor.

2. The package of claim 1,
   wherein the first electrically conductive layer comprises N+ silicon, and
   wherein the second electrically conductive layer comprises N+ poly silicon.

3. The package of claim 1,
wherein the dielectric layer is located in the first trench and over the first electrically conductive layer,
wherein the second electrically conductive layer is located in the first trench and over the dielectric layer, and
wherein the first electrically conductive layer in the first trench, the dielectric layer in the first trench, and the second electrically conductive layer in the first trench, are configured as the first capacitor.

4. The package of claim 1,
wherein the capacitor substrate further comprises a second trench,
wherein the first electrically conductive layer is located in the second trench,
wherein the dielectric layer is located in the second trench and over the first electrically conductive layer,
wherein the second electrically conductive layer is located in the second trench and over the dielectric layer, and
wherein the first electrically conductive layer in the second trench, the dielectric layer in the second trench, and the second electrically conductive layer in the second trench, are configured as a second capacitor.

5. The package of claim 4, wherein the first capacitor and the second capacitor are configured to be electrically coupled together in parallel.

6. The package of claim 1, wherein the capacitor structure comprises:
a first contact layer located over the first electrically conductive layer, wherein the first contact layer is configured as a first electrode for the first capacitor; and
a second contact layer located over the second electrically conductive layer, wherein the second contact layer is configured as a second electrode for the first capacitor.

7. The package of claim 1, further comprising a cavity traveling through the capacitor substrate.

8. The package of claim 7, wherein the first electrically conductive layer is further located over a wall of the cavity.

9. The package of claim 7, wherein the second electrically conductive layer is further located over a wall of the cavity.

10. The package of claim 1, further comprising:
a first cavity traveling through the capacitor substrate;
a first interconnect coupled to the integrated device and the substrate, wherein the first interconnect is located at least in the first cavity of the capacitor substrate;
a second cavity traveling through the capacitor substrate; and
a second interconnect coupled to the integrated device and the substrate, wherein the second interconnect is located at least in the second cavity of the capacitor substrate.

11. The package of claim 10, wherein the first interconnect is coupled to the first electrically conductive layer or the second electrically conductive layer.

12. The package of claim 1, further comprising a second capacitor structure coupled to the substrate, wherein the second capacitor structure comprises:
a second capacitor substrate comprising a trench;
a third electrically conductive layer located in the trench;
a second dielectric layer located over the third electrically conductive layer; and
a fourth electrically conductive layer located over the second dielectric layer,
wherein the third electrically conductive layer located in the trench, the second dielectric layer and the fourth electrically conductive layer, are configured as a second capacitor.

13. The package of claim 12, further comprising a board coupled to the substrate, wherein the second capacitor structure is located between the substrate and the board.

14. The package of claim 1, wherein the capacitor structure further comprises a filler located in the first trench such that the filler is located over the second electrically conductive layer.

15. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

16. An apparatus comprising:
a substrate;
an integrated device coupled to the substrate; and
a capacitor structure located between the substrate and the integrated device, the capacitor structure comprising:
a capacitor substrate; and
first means for trench capacitance located over the capacitor substrate.

17. The apparatus of claim 16, wherein the first means for trench capacitance comprises:
a first trench in the capacitor substrate;
a first electrically conductive layer located in the first trench;
a dielectric layer located over the first electrically conductive layer; and
a second electrically conductive layer located over the dielectric layer.

18. The apparatus of claim 17,
wherein the first electrically conductive layer comprises N+ silicon, and
wherein the second electrically conductive layer comprises N+ poly silicon.

19. The apparatus of claim 16, wherein the first means for trench capacitance is located over a first trench of the capacitor substrate.

20. The apparatus of claim 19, wherein the capacitor structure further comprises second means for trench capacitance located over a second trench of the capacitor substrate.

21. The apparatus of claim 20, wherein the first means for trench capacitance and the second means for trench capacitance are configured to be electrically coupled in parallel.

22. The apparatus of claim 16, further comprising:
a first cavity traveling through the capacitor substrate;
a first interconnect coupled to the integrated device and the substrate, wherein the first interconnect is located at least in the first cavity of the capacitor substrate;
a second cavity traveling through the capacitor substrate; and
a second interconnect coupled to the integrated device and the substrate, wherein the second interconnect is located at least in the second cavity of the capacitor substrate.

23. The apparatus of claim 22, wherein the first interconnect is configured to be electrically coupled to the first means for trench capacitance.

24. The apparatus of claim 16, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

25. A method for fabricating a package, comprising:
providing an integrated device;
coupling a capacitor structure to the integrated device, the capacitor structure comprising:
a capacitor substrate comprising a first trench;
a first electrically conductive layer located in the first trench;
a dielectric layer located over the first electrically conductive layer; and
a second electrically conductive layer located over the dielectric layer, and
wherein the first electrically conductive layer over the first trench, the dielectric layer and the second electrically conductive layer, are configured as a first capacitor,
coupling the integrated device to a substrate such that the capacitor structure is located between the substrate and the integrated device.

26. The method of claim 25,
wherein the first electrically conductive layer comprises N+ silicon, and
wherein the second electrically conductive layer comprises N+ poly silicon.

27. The method of claim 25,
wherein the capacitor substrate further comprises a second trench,
wherein the first electrically conductive layer is located in the second trench,
wherein the dielectric layer is located in the second trench and over the first electrically conductive layer,
wherein the second electrically conductive layer is located in the second trench and over the dielectric layer, and
wherein the first electrically conductive layer in the second trench, the dielectric layer in the second trench, and the second electrically conductive layer in the second trench, are configured as a second capacitor.

28. The method of claim 27, wherein the first capacitor and the second capacitor are configured to be electrically coupled together in parallel.

29. The method of claim 25, wherein coupling a substrate to the integrated device comprises coupling an interconnect to the substrate and the integrated device such the interconnect travels through a cavity in the capacitor substrate of the capacitor structure.

30. The method of claim 25, further forming an encapsulation layer over the substrate and the integrated device such that the encapsulation layer encapsulates the integrated device.

* * * * *